United States Patent
Chu et al.

(10) Patent No.: US 11,942,574 B2
(45) Date of Patent: Mar. 26, 2024

(54) DISPLAY DEVICE AND METHOD OF MANUFACTURING THE SAME

(71) Applicant: Samsung Display Co., LTD., Yongin-si (KR)

(72) Inventors: Seung Jin Chu, Yongin-si (KR); Je Min Lee, Yongin-si (KR); Hyun Kim, Yongin-si (KR); Myeong Hun Song, Yongin-si (KR); Jong Chan Lee, Yongin-si (KR); Woong Hee Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/462,633

(22) Filed: Aug. 31, 2021

(65) Prior Publication Data

US 2022/0181521 A1   Jun. 9, 2022

(30) Foreign Application Priority Data

Dec. 8, 2020   (KR) .................. 10-2020-0170860

(51) Int. Cl.
*H01L 33/38*   (2010.01)
*H01L 33/00*   (2010.01)
*H01L 33/10*   (2010.01)

(52) U.S. Cl.
CPC .......... *H01L 33/387* (2013.01); *H01L 33/005* (2013.01); *H01L 33/10* (2013.01)

(58) Field of Classification Search
CPC . H01L 25/0753; H01L 25/167; H01L 33/005; H01L 33/10; H01L 33/387; H01L 33/60; H01L 33/62
See application file for complete search history.

(56) References Cited

U.S. PATENT DOCUMENTS

| | | | |
|---|---|---|---|
| 2017/0154921 A1* | 6/2017 | Kim | ..................... H01L 33/62 |
| 2018/0097015 A1* | 4/2018 | Gan | ..................... H01L 27/124 |
| 2020/0357955 A1* | 11/2020 | Chuang | ............... H01L 33/385 |
| 2021/0111323 A1 | 4/2021 | Kim et al. | |
| 2021/0143137 A1 | 5/2021 | Kim et al. | |
| 2021/0287579 A1 | 9/2021 | Kang et al. | |

FOREIGN PATENT DOCUMENTS

| | | |
|---|---|---|
| KR | 10-2020-0085770 | 7/2020 |
| KR | 10-2020-0096529 | 8/2020 |
| KR | 10-2021-0057891 | 5/2021 |
| KR | 10-2021-0116793 | 9/2021 |
| WO | 2019/103579 | 5/2019 |
| WO | 2019/135589 | 7/2019 |

\* cited by examiner

*Primary Examiner* — Matthew C Landau
*Assistant Examiner* — Dmitriy Yemelyanov
(74) *Attorney, Agent, or Firm* — KILE PARK REED & HOUTTEMAN PLLC

(57) ABSTRACT

A display device includes a first electrode disposed on a substrate, a first insulating film disposed on the first electrode and having a first opening formed, a second insulating film disposed on the first insulating film and having a second opening, and a contact electrode electrically contacting at least a portion of the first electrode through the first opening and the second opening, wherein a side surface of the first insulating film defines the first opening, and the second insulating film overlaps the side surface of the first insulating film such that the contact electrode and the first insulating film are not in contact with each other.

13 Claims, 16 Drawing Sheets

DISPLAY DEVICE AND METHOD OF MANUFACTURING THE SAME

CROSS-REFERENCE TO RELATED APPLICATION(S)

This application claims priority to and benefits of Korean Patent Application No. 10-2020-0170860 under 35 U.S.C. § 119, filed in the Korean Intellectual Property Office on Dec. 8, 2020, the entire contents of which are incorporated herein by reference.

BACKGROUND

1. Technical Field

The disclosure relates to a display device and a method of manufacturing the same.

2. Description of the Related Art

Recently, as interest in information displays is increasing, research and development for display devices is continuously being conducted.

SUMMARY

An embodiment of the disclosure provides a display device in which an electrode connected to a light-emitting element may be prevented from being disconnected and electrical reliability may be improved, and another embodiment provides a method of manufacturing the same.

It should be noted that aspects of the disclosure are not limited to the above-mentioned aspects, and other aspects of the disclosure will be clearly understood by those skilled in the art from the following description.

According to an embodiment, a display device may include a first electrode disposed on a substrate, a first insulating film disposed on the first electrode and having a first opening, a second insulating film disposed on the first insulating film and having a second opening, and a contact electrode electrically contacting at least a portion of the first electrode through the first opening and the second opening, wherein a side surface of the first insulating film may define the first opening, and the second insulating film may overlap the side surface of the first insulating film such that the contact electrode and the first insulating film may be not in contact with each other.

The first insulating film may include a first refractive layer having a first refractive index, and a second refractive layer disposed on the first refractive layer and having a second refractive index greater than the first refractive index.

The first insulating film may be a distributed Bragg reflector.

The display device may further include a third insulating film disposed on the second insulating film and having a third opening formed therein.

The first opening may have a first diameter, the second opening may have a second diameter, the third opening may have a third diameter, and the first diameter may be greater than the second diameter and may be smaller than the third diameter.

The first diameter may be in a range of about 8 μm to about 10 μm, and the second diameter may be in a range of about 4 μm to about 6 μm.

The display device may further include a light-emitting element disposed on the first insulating film, wherein at least a portion of the second insulating film may be disposed on the light-emitting element.

At least a portion of the contact electrode may be electrically connected to the light-emitting element.

At least a portion of the third insulating film may overlap the second insulating film disposed on the light-emitting element.

The second insulating film may include an inorganic material, and the third insulating film may include an organic material.

The first opening may have a first diameter, the second opening may have a second diameter, the third opening may have a third diameter, and the third diameter may be smaller than the first diameter and may be greater than the second diameter.

A method of manufacturing a display device may include arranging a first electrode on a substrate, forming a first insulating film on the first electrode, forming a second insulating film on the first insulating film, forming a first opening having a first diameter in the first insulating film, forming a second opening having a second diameter in the second insulating film, and patterning a contact electrode to electrically contact the first electrode, wherein the forming of the second opening may include forming the second diameter to be smaller than the first diameter such that the second insulating film may overlap a side surface of the first insulating film.

The patterning of the contact electrode may include allowing the contact electrode to electrically contact the first electrode through the first opening and the second opening.

The forming of the first insulating film may include arranging a first refractive layer having a first refractive index, and arranging a second refractive layer having a second refractive index greater than the first refractive index.

The forming of the first opening and the forming of the second opening may be performed through a dry etching process.

The method may further include forming a third insulating film on the second insulating film, and forming a third opening having a third diameter in the third insulating film.

The forming of the second opening and the forming of the third opening may be performed in a single process.

The forming of the third opening may include etching the third insulating film such that the third diameter may be smaller than the first diameter.

The method may further include arranging a light-emitting element electrically connected to at least a portion of the contact electrode, forming the second insulating film on the light-emitting element, and forming a third insulating film to overlap the second insulating film formed on the light-emitting element, wherein the second insulating film includes an inorganic material, and the third insulating film includes an organic material.

The contact electrode may be spaced apart from the first insulating film by at least a portion of the second insulating film covering on the side surface of the first insulating film.

Technical solutions of the disclosure are not limited to the above, and other technical solutions of the disclosure will be clearly understandable to those having ordinary skill in the art from the disclosure provided below together with accompanying drawings.

DETAILED DESCRIPTION OF THE EMBODIMENTS

Figure 1:
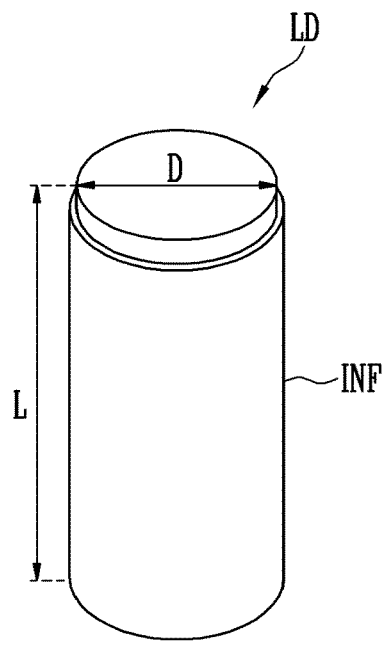
FIGS. 1 and 2 are a schematic perspective and a schematic cross-sectional view illustrating a light-emitting element according to an embodiment.

The disclosure relates to a display device and a method of manufacturing the same. Hereinafter, a display device and a method of manufacturing the same according to embodiments will be described with reference to FIGS. 1 to 24.

Embodiments described in this specification are made to clearly explain the scope of the disclosure to those having ordinary skill in the art, and are not intended so as to be used to limit the disclosure. It should be interpreted that the disclosure may include substitutions and modifications within the spirit of the disclosure.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be understood that when an element is described as being "on" or "connected to" another element, the element may be directly on or connected to the other element, or one or more intervening elements may be present.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The terms used in this specification may be selected from general terms, which may be widely used, based on functions of components according to the embodiment of the disclosure, and may have meanings varying according to the intentions of those skilled in the art, the custom in the field of art or advent of new technology. If a specific term is used with a specific meaning, the meaning of the term will be described specifically. Accordingly, the terms used in this specification should not be defined as simple names of the components, but be defined based on the actual meaning of the terms and the whole context throughout the specification.

The accompanying drawings are to facilitate the explanation of the disclosure, and the shape and sizes in the drawings may be exaggerated for the purpose of convenience of explanation. Accordingly, the disclosure should not be limited to the drawings.

Details of functions and structures which would make the subject matter of the disclosure unclear will be omitted.

It will be understood that the term "connected to" may include a physical or electrical connection or coupling.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Figure 2:
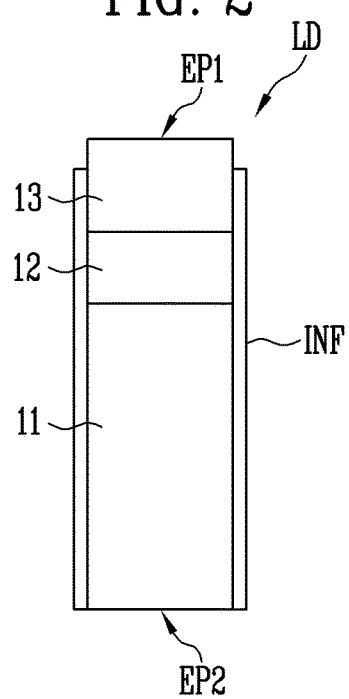

FIGS. 1 and 2 illustrate a light-emitting element LD that may be included in a display device according to embodiments. FIGS. 1 and 2 are a schematic perspective and a schematic cross-sectional view illustrating the light-emitting element according to an embodiment. The light-emitting element LD having a columnar shape is illustrated in FIGS. 1 and 2, but the type and/or shape of the light-emitting element LD are not limited thereto.

Referring to FIGS. 1 and 2, the light-emitting element LD may include a first semiconductor layer 11, a second semiconductor layer 13, and an active layer 12 interposed between the first semiconductor layer 11 and the second semiconductor layer 13. As an example, in case that an extending direction of the light-emitting element LD is regarded as a direction of a direction L, the light-emitting element LD may include the first semiconductor layer 11, the active layer 12, and the second semiconductor layer 13 which may be sequentially stacked in the direction of the direction L.

The light-emitting element LD may be provided in a columnar shape extending in a direction. The light-emitting element LD may have a first end portion EP1 and a second end portion EP2. One of the first and second semiconductor layers 11 and 13 may be adjacent to the first end portion EP1 of the light-emitting element LD. The other of the first and second semiconductor layers 11 and 13 may be adjacent to the second end portion EP2 of the light-emitting element LD.

According to embodiments, the light-emitting element LD may be a light-emitting element manufactured in a columnar shape through an etching method or the like. In the specification, the term "column shape" includes all of a rod-like shape and a bar-like shape, such as a circular column and a polygonal column, which may be long in the direction of the length L (e.g., have an aspect ratio greater than one). A shape of a cross section of the columnar shape is not particularly limited. For example, the length L of the light-emitting element LD may be greater than a diameter D (or width of a cross section) thereof.

The light-emitting element LD may have a small size ranging from a nanometer scale to a micrometer scale. As an example, the light-emitting element LD may have the diameter D (or width) and/or the length L which range from a nanometer scale to a micrometer scale. However, the size of the light-emitting element LD is not limited thereto. The size of the light-emitting element LD may be variously changed according to design conditions of various devices, for example, a display device which uses a light-emitting device including the light-emitting element LD as a light source.

The first semiconductor layer 11 may be a first-conductivity type semiconductor layer. For example, the first semiconductor layer 11 may include an N-type semiconductor layer. As an example, the first semiconductor layer 11 may include an N-type semiconductor layer which includes at least one semiconductor material selected from InAlGaN, GaN, AlGaN, InGaN, AlN, and InN and may be doped with a first-conductivity type dopant such as silicon (Si), germanium (Ge), tin (Sn), or the like, or a combination thereof. However, a material constituting the first semiconductor layer 11 is not limited thereto, and the first semiconductor layer 11 may be made of various materials.

The active layer 12 may be disposed on the first semiconductor layer 11 and may be formed to have a single-quantum well or multi-quantum well structure. The position of the active layer 12 may be variously changed according to the type of the light-emitting element LD.

A clad layer (not shown) doped with a conductive dopant may be formed on and/or under the active layer 12. As an example, the clad layer may be formed as an AlGaN layer or an InAlGaN layer. According to embodiments, a material such as AlGaN or InAlGaN may be used to form the active layer 12, and in addition, various materials may constitute the active layer 12.

The second semiconductor layer 13 may be disposed on the active layer 12 and may include a semiconductor layer which may be a different type from the first semiconductor layer 11. For example, the second semiconductor layer 13 may include a P-type semiconductor layer. As an example, the second semiconductor layer 13 may include a P-type semiconductor layer which includes at least one semiconductor material selected from InAlGaN, GaN, AlGaN, InGaN, AlN, and InN and may be doped with a second-conductivity type dopant such as magnesium (Mg). However, a material constituting the second semiconductor layer 13 is not limited thereto, and the second semiconductor layer 13 may be made of various materials.

In case that a voltage greater than or equal to a threshold voltage is applied to both end portions of the light-emitting element LD, electrons and holes may be combined with each other in the active layer 12, and thus, the light-emitting elements LD may emit light. By controlling light emission of the light-emitting element LD using such a principle, the light-emitting element LD may be used as a light source of various light-emitting devices including pixels of a display device.

The light-emitting element LD may further include an insulating film INF provided on a surface thereof. The insulating film INF may be formed on the surface of the light-emitting element LD so as to surround an outer circumferential surface of at least the active layer 12. In addition, the insulating film INF may further surround one or more areas of the first and second semiconductor layers 11 and 13.

According to embodiments, the insulating film INF may expose both end portions of the light-emitting element LD which may have different polarities. For example, the insulating film INF may expose an end of each of the first and second semiconductor layers 11 and 13 positioned at the first and second end portions EP1 and EP2 of the light-emitting element LD. In another embodiment, the insulating film INF may expose side portions of the first and second semiconductor layers 11 and 13 adjacent to the first and second end portions EP1 and EP2 of the light-emitting element LD which may have different polarities.

According to embodiments, the insulating film INF may be formed as a single-layer or a multi-layer including at least one insulating material selected from silicon oxide ($SiO_x$), silicon nitride ($SiN_x$), silicon oxynitride ($SiO_xN_y$), aluminum oxide ($AlO_x$), and titanium oxide ($TiO_x$) (for example, a double layer made of aluminum oxide ($AlO_x$) and silicon oxide ($SiO_x$)), but the disclosure is not necessarily limited thereto. According to embodiments, the insulating film INF may be omitted In case that the insulating film INF is provided to overlap the surface of the light-emitting element LD, particularly, the outer circumferential surface of the active layer 12, it may be possible to secure the electrical stability of the light-emitting element LD.

In addition, in case that the insulating film INF is provided on the surface of the light-emitting element LD, the surface defects of the light-emitting element LD can be minimized, thereby improving the lifetime and efficiency of the light-emitting element LD. Furthermore, even in case that multiple light-emitting elements LD may be closely disposed, it may be possible to prevent undesired short circuits between the light-emitting elements LD.

In an embodiment, the light-emitting element LD may further include additional components in addition to the first semiconductor layer 11, the active layer 12, the second semiconductor layer 13, and/or the insulating film INF surrounding the first semiconductor layer 11, the active layer 12, and the second semiconductor layer 13. For example, the light-emitting element LD may additionally include at least one fluorescent layer, active layer, semiconductor layer, and/or electrode layer disposed at one end sides of the first semiconductor layer 11, the active layer 12, and/or the second semiconductor layer 13. As an example, a contact electrode layer may be disposed at each of the first and second end portions EP1 and EP2 of the light-emitting element LD.

A light-emitting device including the light-emitting element LD described above may be used in various types of devices including a display device, which may require a light source. For example, the light-emitting elements LD may be disposed in each pixel of a display panel, and the light-emitting elements LD may be used as light sources of each pixel. However, applications of the light-emitting element LD are not limited to the above-described example. For example, the light-emitting element LD may be used in other types of devices, such as a lighting device, which may require a light source.

Figure 3:
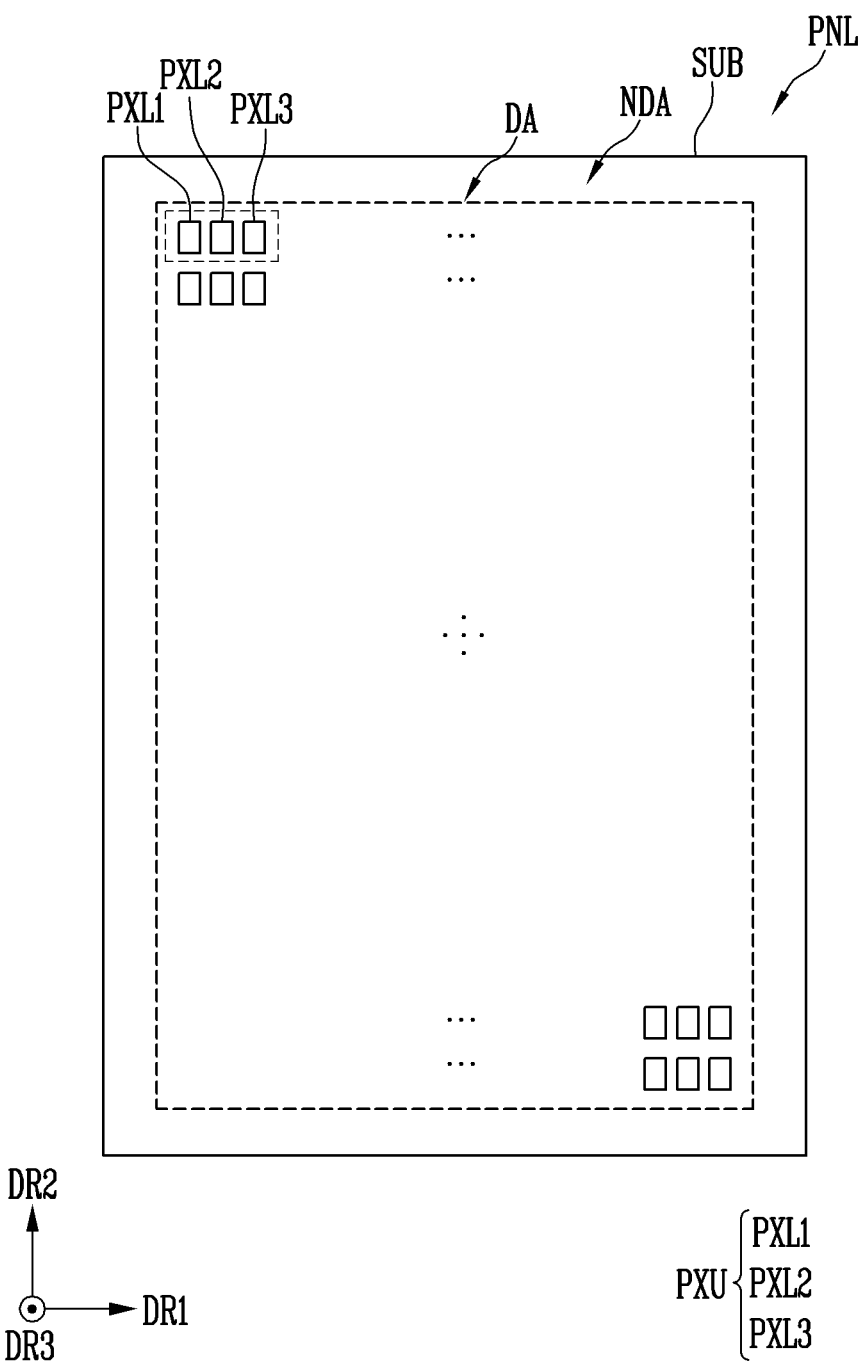
FIG. 3 is a schematic plan view illustrating a display device according to an embodiment.

FIG. 3 is a schematic plan view illustrating a display device according to an embodiment.

As an example of an electronic device which may use the light-emitting element LD described in the embodiments of FIGS. 1 and 2 as a light source, the display device, in particular, a display panel PNL that may be included in the display device is illustrated in FIG. 3.

Each pixel unit PXU of the display panel PNL and each pixel constituting the same may include one or more light-emitting elements LD. For convenience, the structure of the display panel PNL is briefly illustrated in FIG. 3 based on a display area DA. However, according to embodiments, at least one driving circuit unit (for example, at least one of a scan driver and a data driver), lines, and pads may be further disposed in the display panel PNL.

Referring to FIG. 3, the display panel PNL may include a substrate SUB and the pixel unit PXU disposed on the substrate SUB. The pixel units PXU may include first pixels PXL1, second pixels PXL2, and/or third pixels PXL3. Hereinafter, at least one pixel of the first pixels PXL1, the second pixels PXL2, and the third pixels PXL3 will be arbitrarily referred to as a "pixel PXL," or at least two pixels thereof will be collectively referred to as "pixels PXL."

The substrate SUB may constitute a base member of the display panel PNL and may be a rigid or flexible substrate or film. As an example, the substrate SUB may be a rigid substrate made of glass or tempered glass, a flexible substrate (or thin film) made of plastic or metal, or at least one insulating layer. The material and/or physical properties of the substrate SUB are not particularly limited.

In an embodiment, the substrate SUB may be substantially transparent. Here, the term "substantially transparent" may mean that light can be transmitted at a transmittance or more. In another embodiment, the substrate SUB may be semi-transparent or opaque. In addition, the substrate SUB may include a reflective material according to embodiments.

The display panel PNL and the substrate SUB for providing the same may include the display area DA for displaying an image and a non-display area NDA excluding the display area DA.

The pixels PXL may be disposed in the display area DA. Various lines, pads, and/or an embedded circuit unit connected to the pixels PXL of the display area DA may be disposed in the non-display area NDA. The pixels PXL may be regularly arranged according to a stripe or Pentile® arrangement structure. However, the arrangement structure of the pixels PXL is not limited thereto, and the pixels PXL may be arranged in the display area DA in various structures and/or manners.

According to embodiments, two or more types of pixels PXL emitting light having different colors may be disposed in the display area DA. As an example, the first pixels PXL1 emitting first color light, the second pixels PXL2 emitting second color light, and the third pixels PXL3 emitting third color light may be arranged in the display area DA. At least one first pixel PXL1, at least one second pixel PXL2, and at least one third pixel PXL3 disposed adjacent to each other may constitute a pixel unit PXU capable of emitting light having various colors. For example, the first to third pixels PXL1, PXL2, and PXL3 may be subpixels which each emit light having a color. According to embodiments, the first pixel PXL1 may be a red pixel which emits red light, the second pixel PXL2 may be a green pixel which emits green light, and the third pixel PXL3 may be a blue pixel which emits blue light, but the disclosure is not limited thereto.

In an embodiment, the first pixel PXL1, the second pixel PXL2, and the third pixel PXL3 may respectively include a first color light-emitting element, a second color light-emitting element, and a third color light-emitting element as a light source to respectively emit the first color light, the second color light, and the third color light. In another embodiment, the first pixel PXL1, the second pixel PXL2, and the third pixel PXL3 may include light-emitting elements which emit the same color light. In addition, the first pixel PXL1, the second pixel PXL2, and the third pixel PXL3 may include color conversion layers and/or color filters having different colors, which may be disposed on the light-emitting elements, thereby emitting the first color light, the second color light, and the third color light. However, the color, type, and/or number of the pixels PXL constituting each pixel unit PXU are not particularly limited. For example, the color of light emitted by each pixel PXL may be variously changed.

A pixel PXL may include at least one light source driven by control signals (for example, a scan signal and a data signal) and/or power sources (for example, a first power source and a second power source). In an embodiment, the light source may include at least one light-emitting element LD according to any embodiment of the embodiments of FIGS. 1 and 2, for example, a micro/nano column-shaped light-emitting element LD having a small size ranging from a nanometer scale to a micrometer scale. However, the disclosure is not necessarily limited thereto, and in addition, various types of light-emitting elements LD may be used as the light source of the pixel PXL.

In an embodiment, each pixel PXL may be formed as an active pixel. However, the type, structure, and/or driving method of the pixels PXL applicable to the display device are not particularly limited. For example, each pixel PXL having various structures and/or driving methods may be formed as a pixel of a passive or active light-emitting display device.

Figure 4:
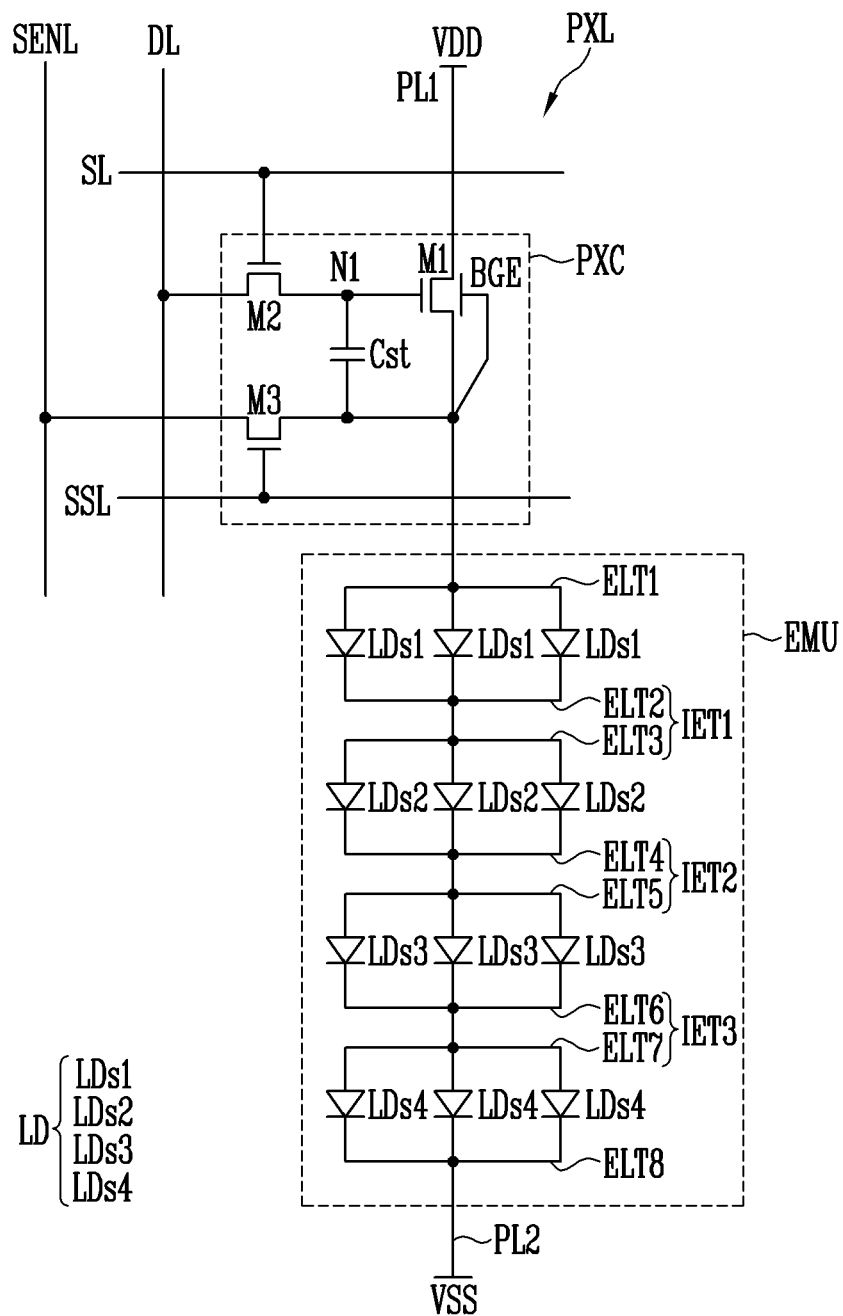
FIG. 4 is a schematic circuit diagram illustrating a pixel according to an embodiment of the disclosure.

FIG. 4 is a schematic circuit diagram illustrating a pixel according to an embodiment of the disclosure. For example, FIG. 4 illustrates an embodiment of a pixel PXL that may be applicable to an active display device. However, the types of the pixel PXL and the display device to which embodiments of the disclosure may be applied are not limited thereto. The pixel PXL shown in FIG. 4 may be any of the first pixel PXL1, the second pixel PXL2, and the third pixel PXL3 provided in the display panel PNL of FIG. 3.

Referring to FIG. 4, the pixel PXL may include a light-emitting unit EMU which generates light having luminance corresponding to a data signal. The light-emitting unit EMU may include light-emitting elements LD. The light-emitting elements LD may include first light-emitting elements LDs1, second light-emitting elements LDs2, third light-emitting elements LDs3, and fourth light-emitting elements LDs4. The pixel PXL may include a pixel circuit PXC for driving the light-emitting unit EMU.

The light-emitting unit EMU may include the light-emitting elements LD connected between a first power source VDD and a second power source VSS. First end portions (for example, P-type end portions) of the light-emitting elements LD may be connected to the first power source VDD through the pixel circuit PXC, a first power line PL1, and the like, and/or second end portions (for example, N-type end portions) of the light-emitting elements LD may be connected to the second power source VSS through a second power line PL2 and the like.

According to embodiments, the light-emitting elements LD may be connected to each other through various connection structures between the first power source VDD and the second power source VSS. As an example, the light-emitting elements LD may be connected only in parallel or may be connected only in series. Alternatively, the light-emitting elements LD may be connected in a series-parallel combination structure.

For example, as shown in FIG. 4, the light-emitting elements LD may be divided into four series stages and connected in series/parallel. Each series stage may include a pair of electrodes (for example, two electrodes) and one or more light-emitting element LD connected between the pair of electrodes. Here, the numbers of the light-emitting elements LD constituting the series stages may be the same or different, and the number of the light-emitting elements LD is not particularly limited.

For example, a first series stage may include a first electrode ELT1, a second electrode ELT2, and one or more light-emitting electrodes LDs1 connected between the first electrode ELT1 and the second electrode ELT2, and a second series stage may include a third electrode ELT3, a fourth electrode ELT4, and one or more light-emitting elements LDs2 connected between the third electrode ELT3 and the fourth electrode ELT4. Similarly, a third series stage may include a fifth electrode ELT5, a sixth electrode ELT6, and one or more light-emitting elements LDs3 connected between the fifth electrode ELT5 and the sixth electrode ELT6, and a fourth series stage may include a seventh electrode ELT7, an eighth electrode ELT8, and one or more light-emitting elements LDs4 connected between the seventh electrode ELT7 and the eighth electrode ELT8.

The first electrode ELT1 may be a first pixel electrode (or anode) of the light-emitting unit EMU. A last electrode of the light-emitting unit EMU, for example, the eighth electrode ELT8 may be a second pixel electrode (or cathode) of the light-emitting unit EMU.

The second to seventh electrodes ELT2 to ELT7 may each constitute an intermediate electrode. For example, the second and third electrodes ELT2 and ELT3 may be integrally or non-integrally connected to each other to form a first intermediate electrode IET1. Similarly, the fourth electrode ELT4 and the fifth electrode ELT5 may be integrally or non-integrally connected to each other to form a second intermediate electrode IET2, and the sixth electrode ELT6 and the seventh electrode ELT7 may be integrally or non-integrally connected to each other to form a third intermediate electrode IET3. The second and third electrodes ELT2 and ELT3 may be integrated to be regarded as one first intermediate electrode IET1, the fourth and fifth electrodes ELT4 and ELT5 may be integrated to be regarded as one second intermediate electrode IET2, and the sixth and seventh electrodes ELT6 and ELT7 may be integrated to be regarded as one third intermediate electrode IET3.

FIG. 4 illustrates an embodiment in which the light-emitting elements LD may be connected in a series-parallel combination structure, but the disclosure is not limited thereto. For example, the light-emitting elements LD provided in the light-emitting unit EMU of each pixel PXL may be connected only in series or only in parallel.

Each of the light-emitting elements LD may include the first end portion (for example, the P-type end portion) connected to the first power source VDD through the first pixel electrode (for example, the first electrode ELT1), the pixel circuit PXC, the first power line PL1, and/or the like, and the second end portion (for example, the N-type end portion) connected to the second power source VSS through the second pixel electrode (for example, the eighth electrode ELT8), the second power line PL2, and the like. For example, the light-emitting elements LD may be connected in a forward direction between the first power source VDD and the second power source VSS. As described above, each of the light-emitting elements LD connected in the forward direction between the first power source VDD and the second power source VSS may constitute each effective light source. The effective light sources may be clustered to constitute the light-emitting unit EMU of the pixel PXL.

The first power source VDD and the second power source VSS may have different potentials such that the light-emitting elements LD emit light. As an example, the first power source VDD may be set as a high potential power source, and the second power source VSS may be set as a low potential power source. The first power source VDD and the second power source VSS may have a potential difference such that the light-emitting elements LD emit light during an emission period of the pixel PXL.

In case that a driving current is supplied through the corresponding pixel circuit PXC, the light-emitting elements LD may emit light with luminance corresponding to the driving current. For example, during each frame period, the pixel circuit PXC may supply a driving current corresponding to a gradation value expressed in a corresponding frame to the light-emitting unit EMU. Accordingly, while the light-emitting element LD emit light with luminance corresponding to a driving current, the light-emitting unit EMU may emit light with luminance corresponding to the driving current.

In an embodiment, the light-emitting unit EMU may further include at least one ineffective light source in addition to the light-emitting elements LD each constituting the effective light source. As an example, at least one ineffective light-emitting element, which may be arranged in a reverse direction or of which at least one end portion may be enabled, may be further connected to at least one series stage. Even in case that a driving voltage (for example, a forward driving voltage) may be applied between the first pixel electrode and the second pixel electrode, the ineffective light-emitting element may maintain an inactive state and thus may maintain substantially a non-emission state.

The pixel circuit PXC may be connected between the first power source VDD and the light-emitting unit EMU. The pixel circuit PXC may be connected to a scan line SL and a data line DL of the corresponding pixel PXL. In addition, the pixel circuit PXC may be further selectively connected to a sensing signal line SSL and a sensing line SENL.

The pixel circuit PXC may include a first transistor M1, a second transistor M2, a third transistor M3, and a storage capacitor Cst.

The first transistor M1 may be connected between the first power source VDD and the first electrode ELT1 of the light-emitting unit EMU. A gate electrode of the first transistor M1 may be connected to a first node N1. The first transistor M1 may control a driving current supplied to the light-emitting unit EMU in response to a voltage of the first node N1. For example, the first transistor M1 may be a driving transistor which controls a driving current of the pixel PXL.

In addition, the pixel circuit PXC may further include a back gate electrode BGE connected to the first electrode ELT1. The back gate electrode BGE may be disposed to overlap a gate electrode of the first transistor M1 (see "GE" of FIG. 6) with an insulating layer interposed therebetween.

The second transistor M2 may be connected between the data line DL and the first node N1. A gate electrode of the second transistor M2 may be connected to the scan line SL. In case that a scan signal having a gate-on voltage (for example, a high level voltage) is supplied from the scan line SL, the second transistor M2 may be turned on to electrically connect the data line DL and the first node N1.

During each frame period, a data signal of a corresponding frame may be supplied to the data line DL, and the data signal may be transmitted to the first node N1 through the second transistor M2 turned on during a period in which the scan signal having a gate-on voltage may be supplied. For example, the second transistor M2 may be a switching transistor for transmitting each data signal into the pixel PXL.

An electrode of the storage capacitor Cst may be connected to the first node N1, and another electrode thereof may be connected to the first electrode ELT1 of the light-emitting unit EMU (second electrode of the first transistor M1). The storage capacitor Cst may be charged with a voltage corresponding to a data signal supplied to the first node N1 during each frame period.

The third transistor M3 may be connected between the first electrode ELT1 of the light-emitting unit EMU and the sensing line SENL. A gate electrode of the third transistor M3 may be connected to the sensing signal line SSL. The third transistor M3 may transmit a voltage value applied to the first electrode ELT1 of the light-emitting unit EMU (or voltage value applied to an anode of the light-emitting element LD) to the sensing line SENL according to a sensing signal supplied to the sensing signal line SSL during a sensing period. The voltage value transmitted through the sensing line SENL may be provided to an external circuit (for example, a timing controller), and the external circuit may extract characteristic information of each pixel PXL (for example, a threshold voltage and the like of the first transistor M1) based on the supplied voltage value. The extracted characteristic information may be used to convert image data so that a characteristic deviation between the pixels PXL may be compensated for.

In FIG. 4, the transistors included in the pixel circuit PXC, for example, all of the first, second, and third transistors M1, M2, and M3 are illustrated as being N-type transistors, but the disclosure is not limited thereto. For example, at least one of the first, second, and third transistors M1, M2, and M3 may be changed to a P-type transistor. In another embodiment, the pixel circuit PXC may include P-type and N-type transistors in combination. For example, some of the transistors included in the pixel circuit PXC may be P-type transistors, and the others may be N-type transistors. A voltage level of control signals (for example, a scan signal, a data signal, and/or a sensing signal) for driving each transistor may be adjusted according to the type of transistors.

In addition, the structure and driving method of the pixel PXL may be variously changed according to embodiments. For example, the pixel circuit PXC may be provided as a pixel circuit having various structures and/or driving methods in addition to the embodiment shown in FIG. 4.

As an example, the pixel circuit PXC may not include the third transistor M3. In addition, the pixel circuit PXC may further include additional circuit elements such as a transistor for compensating for a threshold voltage of the first transistor M1, a transistor for initializing a voltage of the first node N1 or the first electrode ELT1 of the light-emitting unit EMU, a transistor for controlling a period in which a driving current may be supplied to the light-emitting unit EMU, and/or a boosting capacitor for boosting the voltage of the first node N1.

In another embodiment, in case that each pixel PXL is provided in a passive light-emitting display device or the like, the pixel circuit PXC may be omitted. Each of the first and second pixel electrodes of the light-emitting unit EMU may be connected directly to the scan line SL, the data line DL, the first power line PL1, the second power line PL2, or other signal lines or power lines.

Figure 5:
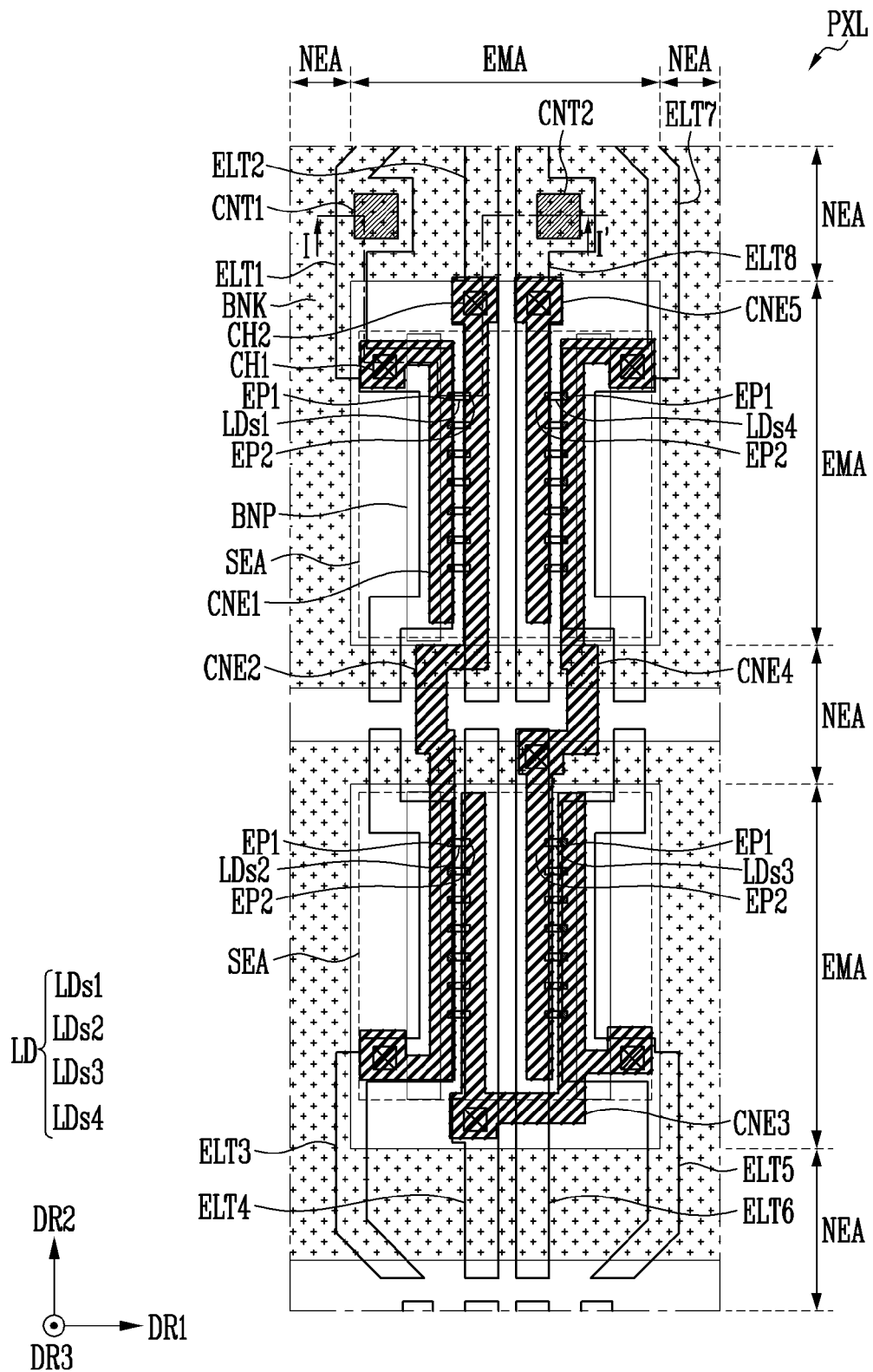
FIG. 5 is a schematic plan view illustrating a pixel according to an embodiment.

FIG. 5 is a schematic plan view illustrating a pixel according to an embodiment. A pixel PXL shown in FIG. 5 may be any of a first pixel PXL1, a second pixel PXL2, and a third pixel PXL3.

Referring to FIG. 5, the pixel PXL may include first to eighth electrodes ELT1 to ELT8 and light-emitting elements LD. As described above, the light-emitting elements LD may include first to fourth light-emitting elements LDs1 to LDs4.

Among the first to eighth electrodes ELT1 to ELT8, a pair of electrodes constituting each series stage may be disposed adjacent to an area in which the light-emitting elements LD may be arranged. The first to eighth electrodes ELT1 to ELT8 may each be disposed to extend in a second direction DR2 and to be spaced apart from each other in a first direction DR21.

The first light-emitting elements LDs1 may be disposed between the first electrode ELT1 and the second electrode ELT2. The second light-emitting elements LDs2 may be disposed between the third electrode ELT3 and the fourth electrode ELT4. The third light-emitting elements LDs3 may be disposed between the fifth electrode ELT5 and the sixth electrode ELT6. The fourth light-emitting elements LDs4 may be disposed between the seventh electrode ELT7 and the eighth electrode ELT8.

The first to fourth light-emitting elements LDs1 to LDs4 may be positioned in a sub-emission area SEA when viewed in a plan view. The sub-emission area SEA may refer to an emission area EMA of any of the first to third pixels PXL1 to PXL3. As shown in FIG. 5, at least one non-emission area NEA may be adjacent to at least one emission area EMA in some embodiments. The first to fourth light-emitting elements LDs1 to LDs4 may be arranged in the second direction DR2 when viewed in a plan view. For example, the first light-emitting elements LDs1 may be provided as multiple light-emitting elements, and each of the first light-emitting elements LDs1 may be positioned in the second direction DR2 in the sub-emission area SEA.

The first to eighth electrodes ELT1 to ELT8 may be pixel electrodes of each pixel PXL. A portion of any of the first to eighth electrodes ELT1 to ELT8 may be first formed as an alignment line and then may be disconnected and separated into the pixel electrodes between adjacent pixels PXL and/or between the sub-emission areas SEA of each pixel PXL.

One of the pixel electrodes, for example, the first electrode ELT1, may be electrically connected to a pixel circuit PXC and/or a first power line PL1 through a first contact portion CNT1. Another of the pixel electrodes, for example, the eighth electrode ELT8, may be electrically connected to a second power line PL2 through a second contact portion CNT2.

At least one of the first to eighth electrodes ELT1 to ELT8 may be disposed on a bank pattern BNP. According to an example, the first electrode ELT1 and the second electrode ELT2 may be arranged on the bank pattern BNP. The first electrode ELT1 and the second electrode ELT2 may protrude in a third direction DR3 due to the bank pattern BNP to reflect light emitted from the light-emitting element LD, and thus, the luminous efficiency of the pixel PXL may be improved.

The first to eighth electrodes ELT1 to ELT8 may be connected directly to the light-emitting element LD or connected directly to the light-emitting element LD through separate contact electrodes (for example, first to fifth contact electrodes CNE1 to CNE5).

Electrodes disposed in adjacent sub-emission area SEA may be connected to each other through at least one contact electrode. To this end, the pixel PXL may include the first to third contact electrodes CNE1 to CNE3. For example, referring to FIG. 5, the second electrode ELT2 and the third electrode ELT3 may be electrically connected through the second contact electrode CNE2.

The first contact electrode CNE1 may be disposed on the first light-emitting elements LDs1 of a first series stage and the first electrode ELT1 to connect the light-emitting elements LDs1 of the first series stage to the first electrode ELT1.

The second contact electrode CNE2 may be disposed on the first light-emitting elements LDs1 of the first series stage and the second electrode ELT2 to connect the first light-emitting elements LDs1 of the first series stage to the second electrode ELT2. In addition, the second contact electrode CNE2 may be disposed on the second light-emitting elements LDs2 of a second series stage and the third electrode ELT3 to connect the second light-emitting elements LDs2 of the second series stage to the third electrode ELT3.

The third contact electrode CNE3 may be disposed on the second light-emitting elements LDs2 of the second series stage and the fourth electrode ELT4 to connect the second light-emitting elements LDs2 of the second series stage to the fourth electrode ELT4. In addition, the third contact electrode CNE3 may be disposed on the third light-emitting elements LDs3 of a third series stage and the fifth electrode ELT5 to connect the third light-emitting elements LDs3 of the third series stage to the fifth electrode ELT5.

The fourth contact electrode CNE4 may be disposed on the third light-emitting elements LDs3 of the third series stage and the sixth electrode ELT6 to connect the third light-emitting elements LDs3 of the third series stage to the sixth electrode ELT6. In addition, the fourth contact electrode CNE4 may be disposed on the fourth light-emitting elements LDs4 of a fourth series stage and the seventh electrode ELT7 to connect the fourth light-emitting elements LDs4 of the fourth series stage to the seventh electrode ELT7.

The fifth contact electrode CNE5 may be disposed on the fourth light-emitting elements LDs4 of the fourth series stage and the eighth electrode ELT8 to connect the fourth light-emitting elements LDs4 of the fourth series stage to the eighth electrode ELT8.

At least one layer of an insulating film may be interposed between any of the first to fifth contact electrodes CNE1 to CNE5 and any of the first to eighth electrodes ELT1 to ELT8, and each contact electrode and an electrode corresponding thereto may be connected to each other through first and second contact holes CH1 and CH2 formed in the insulating film.

Figure 6:
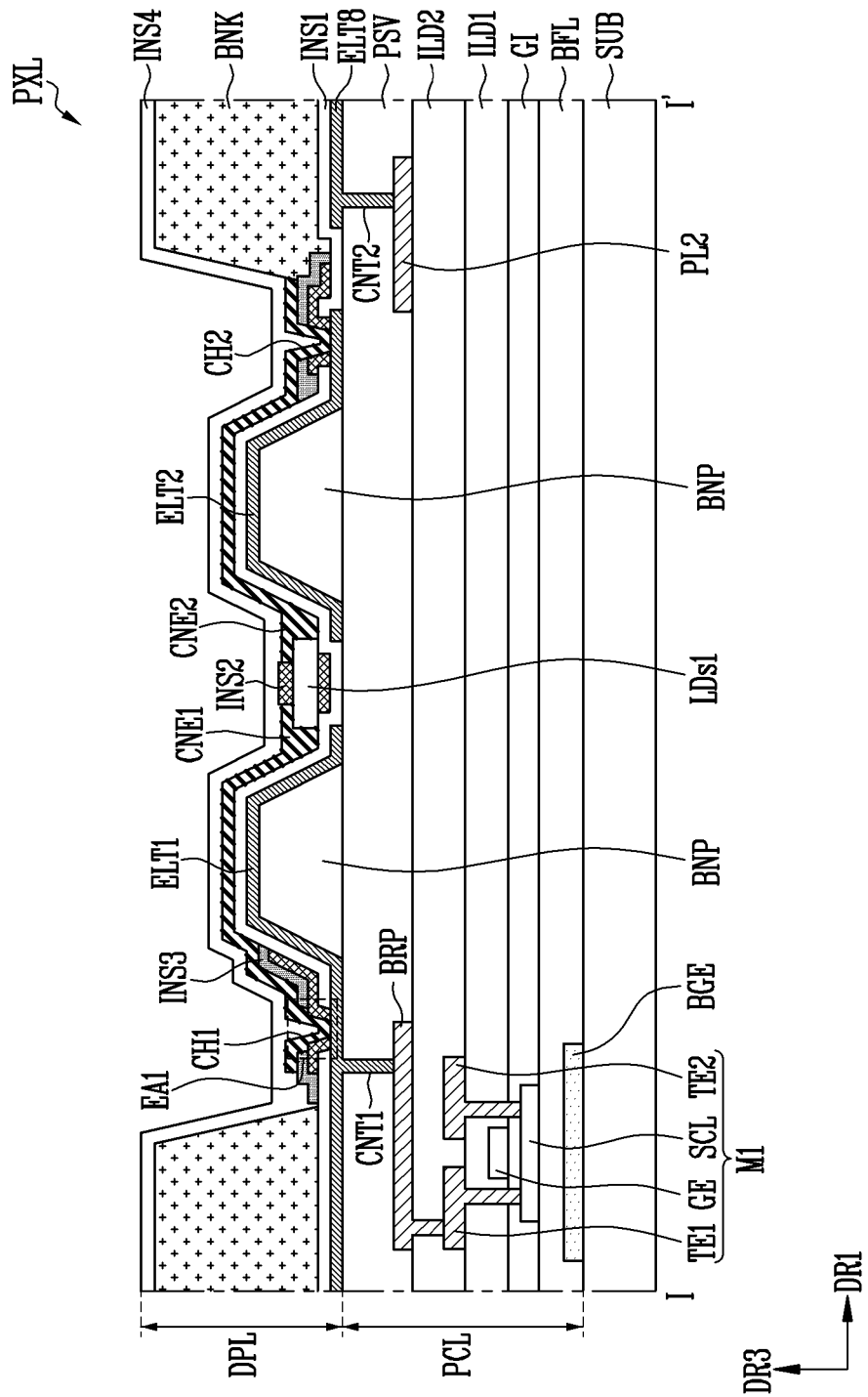
FIGS. 6, 7, and 8 are schematic cross-sectional views taken along line I-I' of FIG. 5.
Figure 7:
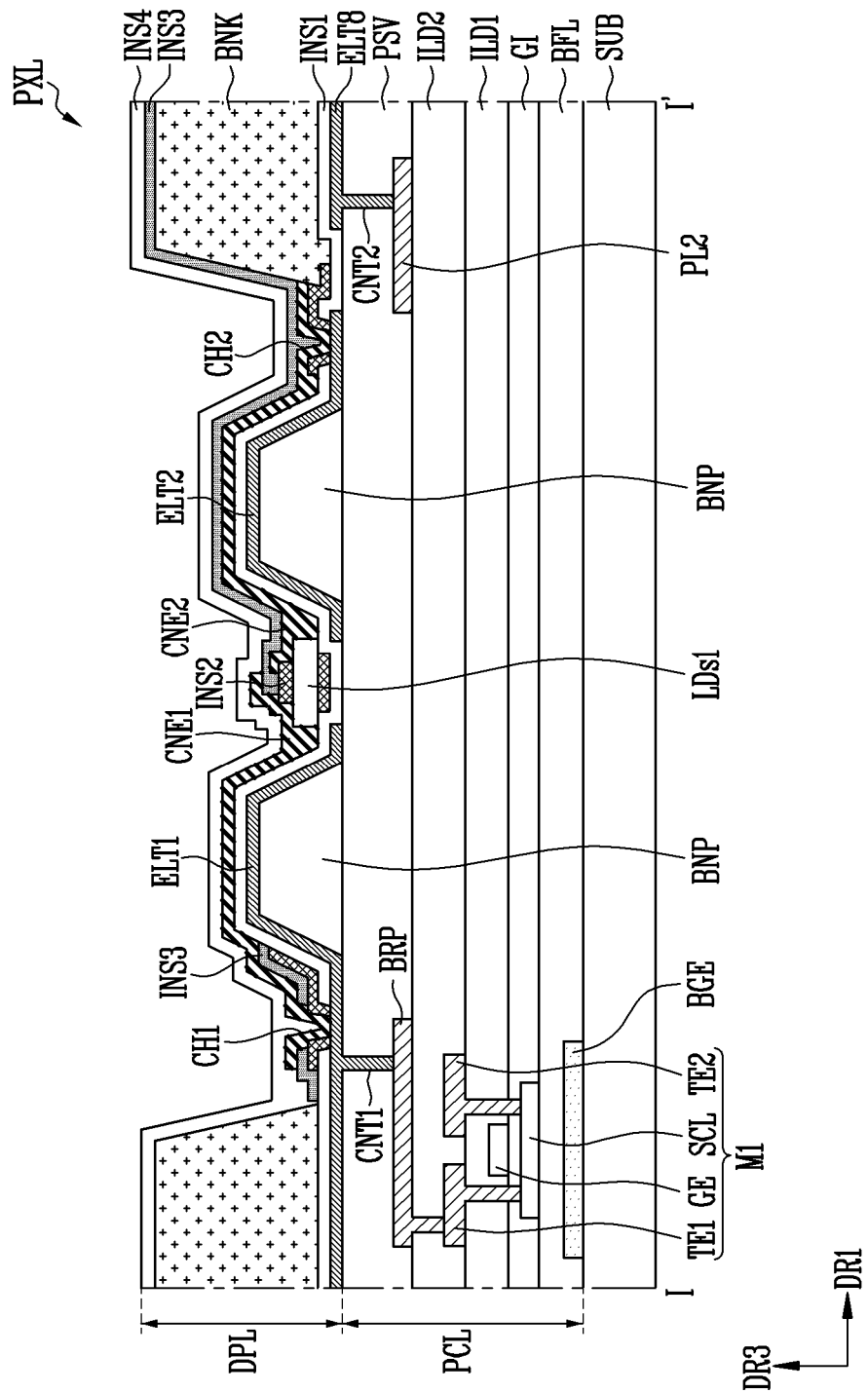
Figure 8:
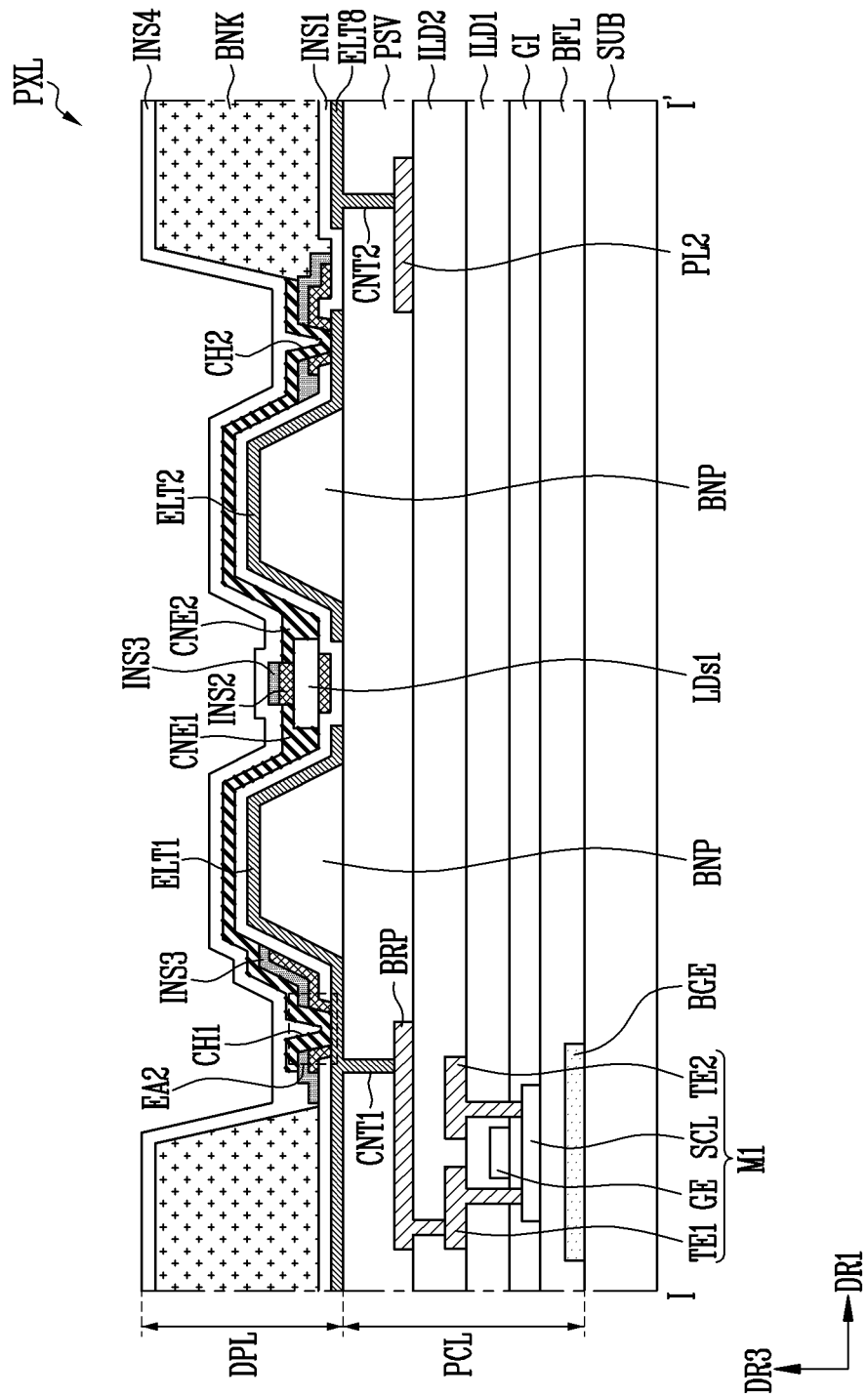

FIGS. 6, 7, and 8 are schematic cross-sectional views taken along line I-I' of FIG. 5. FIG. 6 is a schematic view illustrating a pixel PXL according to an embodiment, FIG. 7 is a schematic view illustrating a pixel PXL according to another embodiment, and FIG. 8 is a schematic view illustrating a pixel PXL according to still another embodiment. In FIGS. 6 to 8, for convenience of description, descriptions will be given based on a construction of a transistor corresponding to the first transistor M1 among the transistors shown in FIG. 4, and descriptions will be given based on a first light-emitting element LDs1 among light-emitting elements LD.

First, referring to FIG. 6, the pixel PXL according to an embodiment may include a substrate SUB, a pixel circuit part PCL, and a display element part unit DPL.

The substrate SUB may constitute a base surface of the pixel PXL. The substrate SUB may be a rigid or flexible substrate. According to an example, the substrate SUB may include a rigid material or a flexible material, but the disclosure is not limited to a specific example.

The pixel circuit part PCL may include a buffer film BFL, a back gate electrode BGE, a first transistor M1, a gate insulating film GI, a first interlayer insulating film ILD1, a second interlayer insulating film ILD2, a bridge pattern BRP, a second power line PL2, a first contact portion CNT1, a second contact portion CNT2, and a protective film PSV.

The buffer film BFL may be disposed on the substrate SUB. The buffer film BFL may prevent impurities from being diffused from the outside. The buffer film BFL may include at least one selected from metal oxides such as silicon nitride ($SiN_x$), silicon oxide ($SiO_x$), silicon oxynitride ($SiO_xN_y$), and aluminum oxide ($AlO_x$).

The back gate electrode BGE may be positioned on the buffer film BFL. The back gate electrode BGE may overlap a gate electrode GE when viewed in a plan view.

The first transistor M1 may be a thin film transistor. According to an example, the first transistor M1 may be a driving transistor. The first transistor M1 may include a semiconductor layer SCL, a first transistor electrode TE1, a second transistor electrode TE2, and the gate electrode GE.

The semiconductor layer SCL may be positioned on the buffer film BFL. The semiconductor layer SCL may include at least one selected from polysilicon, amorphous silicon, and an oxide semiconductor.

The semiconductor layer SCL may include a first contact region electrically contacting the first transistor electrode TE1 and a second contact region electrically contacting the second transistor electrode TE2.

The first contact region and the second contact region may be semiconductor patterns doped with impurities. A region between the first contact region and the second contact region may be a channel region. The channel region may be an intrinsic semiconductor pattern that may not be doped with impurities.

The gate insulating film GI may be provided on the semiconductor layer SCL. The gate insulating film GI may include an inorganic material. According to an example, the gate insulating film GI may include at least one selected from silicon nitride ($SiN_x$), silicon oxide ($SiO_x$), silicon oxynitride ($SiO_xN_y$), and aluminum oxide ($AlO_x$). According to embodiments, the gate insulating film GI may include an organic material.

The gate electrode GE may be positioned on the gate insulating film GI. The position of the gate electrode GE may correspond to the position of the channel region of the semiconductor layer SCL. For example, the gate electrode GE may be disposed on the channel region of the semiconductor layer SCL with the gate insulating film GI interposed therebetween.

The first interlayer insulating film ILD1 may be positioned on the gate electrode GE. Like the gate insulating film GI, the first interlayer insulating film ILD1 may include at least one selected from silicon nitride ($SiN_x$), silicon oxide ($SiO_x$), silicon oxynitride ($SiO_xN_y$), and aluminum oxide ($AlO_x$).

The first transistor electrode TE1 and the second transistor electrode TE2 may be positioned on the first interlayer insulating film ILD1. The first transistor electrode TE1 may pass through the gate insulating film GI and the first interlayer insulating film ILD1 to be in contact the first contact region of the semiconductor layer SCL, and the second transistor electrode TE2 may pass through the gate insulating film GI and the first interlayer insulating film ILD1 to electrically contact the second contact region of the semiconductor layer SCL. According to an example, the first transistor electrode TE1 may be a source electrode, and the second transistor electrode TE2 may be a drain electrode, but the disclosure is not limited thereto.

The second interlayer insulating film ILD2 may be positioned on the first transistor electrode TE1 and the second transistor electrode TE2. Like the first interlayer insulating film ILD1 and the gate insulating film GI, the second interlayer insulating film ILD2 may include an inorganic material. Examples of the inorganic material may include at least one selected from the materials described as the structural materials of the first interlayer insulating film ILD1 and the gate insulating film GI, for example, at least one selected from silicon nitride ($SiN_x$), silicon oxide ($SiO_x$), silicon oxynitride ($SiO_xN_y$), and aluminum oxide ($AlO^x$). According to embodiments, the second interlayer insulating film ILD2 may include an organic material.

The bridge pattern BRP may be disposed on the second interlayer insulating film ILD2. The bridge pattern BRP may be connected to the first transistor electrode TE1 through a contact hole passing through the second interlayer insulating film ILD2.

The second power line PL2 may be disposed on the second interlayer insulating film ILD2. The second power line PL2 may be connected to an eighth electrode ELT8 through the second contact portion CNT2. As described above with reference to FIG. 4, the second power line PL2 may be electrically connected to the light-emitting element LD to supply power.

The protective film PSV may be positioned on the second interlayer insulating film ILD2. The protective film PSV may overlap the bridge pattern BRP and the second power line PL2. The protective film PSV may be provided in the form including an organic insulating film, an inorganic insulating film, or an organic insulating film disposed on an inorganic insulating film.

The protective film PSV may include the first contact portion CNT1 connected to a region of the bridge pattern BRP and the second contact portion CNT2 connected to a region of the second power line PL2.

The display element part unit DPL may include first to eighth electrodes ELT1 to ELT8. However, hereinafter, for convenience of explanation, descriptions will be given based on the first electrode ELT1, the second electrode ELT2, and the eighth electrode ELT8.

The display element part unit DPL may include the first electrode ELT1, the second electrode ELT2, the eighth electrode ELT8, a first insulating film INS1, a second insulating film INS2, a third insulating film INS3, a fourth insulating film INS4, a first contact hole CH1, a second contact hole CH2, a bank pattern BNP, a first contact electrode CNE1, a second contact electrode CNE2, the first light-emitting element LDs1, and a bank BNK.

The first electrode ELT1, the second electrode ELT2, and the eighth electrode ELT8 may be arranged on the protective film PSV. According to embodiments, at least a portion of each of the first electrode ETL1 and the second electrode ELT2 may be arranged on the bank pattern BNP.

The first electrode ELT1 may be electrically connected to the bridge pattern BRP through the first contact portion CNT1, and a voltage may be applied thereto from a first power source VDD. A voltage may be applied to the second electrode ELT2 from a second power source VSS. The eighth electrode ELT8 may be electrically connected to the second power line PL2 through the second contact portion CNT2.

At least a portion of each of the first electrode ELT1 and the second electrode ELT2 may be arranged on a surface of the bank pattern BNP. Accordingly, the first electrode ELT1 and the second electrode ELT2 may reflect light emitted from the first light-emitting element LDs1 in a display direction of a display device so that it may be possible to improve the luminous efficiency of the first light-emitting element LDs1. The display direction may refer to a third direction DR3.

At least a portion of the first insulating film INS1 may be positioned on the protective film layer PSV, and at least another portion of the first insulating film INS1 may be arranged on the first electrode ELT1, the second electrode ELT2, or the eighth electrode ELT8. The first insulating film INS1 may stabilize electrical connection with respect to the first electrode ELT1, the second electrode ELT2, and/or the eighth electrode ELT8 and may reduce external influences.

Figure 9:
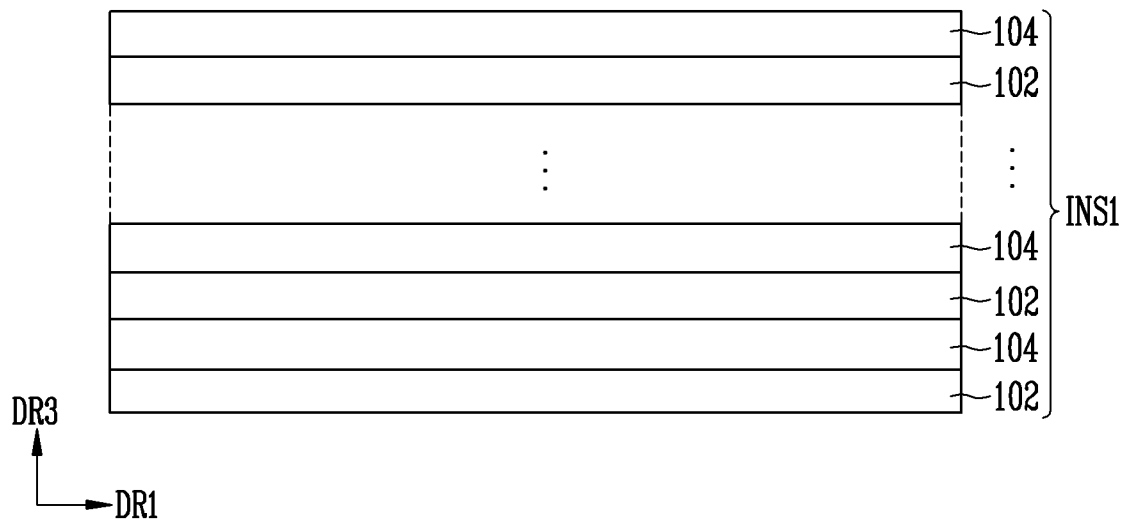
FIG. 9 is a schematic cross-sectional view illustrating a structure of a first insulating film according to an embodiment.

The first insulating film INS1 may be provided as multiple layers. Hereinafter, the detailed structure of the first insulating film INS1 will be described with reference to FIG. 9. FIG. 9 is a schematic cross-sectional view illustrating a structure of the first insulating film according to an embodiment.

The first insulating film INS1 may include a structure in which multiple layers having different refractive indices may be alternately arranged with each other. The first insulating film INS1 may be a reflector configured to reflect at least a portion of light. The first insulating film INS1 may be configured to function as a distributed Bragg reflector (DBR). The first insulating film INS1 may be configured to function as the DBR, thereby improving the luminous efficiency of the first light-emitting element LDs1.

As an example, referring to FIG. 9, the first insulating film INS1 may include a first refractive layer 102 and a second refractive layer 104. The first refractive layer 102 and the second refractive layer 104 may be alternately arranged with each other. The number and thickness of each of the first and second refractive layers 102 and 104 are not limited to a specific example.

A refractive index of the first refractive layer 102 may be different from a refractive index of the second refractive layer 104. The refractive index of the first refractive layer 102 may be smaller than that of the second refractive layer 104. Therefore, the first insulating film INS1 may have a structure in which the first refractive layer 102 having a first refractive index and the second refractive layer 104 having a second refractive index greater than the first refractive index may be alternately positioned.

The first refractive layer 102 and the second refractive layer 104 may include an organic material or an inorganic material. The first refractive layer 102 and the second refractive layer 104 may include at least one selected from silicon nitride ($SiN_x$), silicon oxide ($SiO_x$), silicon oxynitride ($SiO_xN_y$), titanium oxide ($TiO_x$), and aluminum oxide ($AlO_x$). According to an example, the first refractive layer 102 may include silicon oxide ($SiO_x$), and the second refractive layer 104 may include titanium oxide ($TiO_x$). However, the substance or material included in the first refractive layer 102 and the second refractive layer 104 are not limited to the above-described examples.

Referring again to FIG. 6, a first contact hole CH1 and a second contact hole CH2 may be provided in the pixel PXL.

The first contact hole CH1 may be a path through which the first contact electrode CNE1 and the first electrode ELT1 may be connected. The first contact hole CH1 may be formed to pass through the first insulating film INS1, the second insulating film INS2, and the third insulating film INS3.

The second contact hole CH2 may be a path through which the second contact electrode CNE2 and the second electrode ELT2 may be connected. The second contact hole CH2 may be formed to pass through the first insulating film INS1, the second insulating film INS2, and the third insulating film INS3.

Details of the first contact hole CH1 and the second contact hole CH2 will be described below with reference to FIGS. 10 and 11, and thus, repetitive description will be omitted.

The bank BNK may be a structure defining an emission area of the pixel PXL. The emission area EMA may be an area in which light may be emitted from the first light-emitting element LDs1. For example, the bank BNK may be disposed to surround at least a portion of the first light-emitting element LDs1 of the pixel PXL. The bank BNK may include at least one selected from an organic material and an inorganic material.

The first connection electrode CNE1 and the second connection electrode CNE2 may be positioned on the first insulating film INS1. The first contact electrode CNE1 may be electrically connected to the first electrode ELT1 through the first contact hole CH1, and the second contact electrode CNE2 may be electrically connected to the second electrode ELT2 through the second contact hole CH2. The first contact electrode CNE1 may be electrically connected to an end portion of the first light-emitting element LDs1, and the second contact electrode CNE2 may be electrically connected to the other end portion of the first light-emitting element LDs1. As a result, an electrical signal provided through the first electrode ELT1 may be provided to the first light-emitting element LDs1 through the first contact electrode CNE1, and an electrical signal provided through the second electrode ELT2 may be provided to the first light-emitting element LDs1 through the second contact electrode CNE2.

The bank pattern BNP may have a shape protruding in the display direction (for example, the third direction DR3) of the light-emitting element. The bank pattern BNP may be arranged to surround at least a portion of an area in which the first light-emitting element LDs1 may be arranged when viewed in a plan view. According to an example, like the bank BNK, the bank pattern BNP may include at least one selected from an organic material and an inorganic material.

At least a portion of the second insulating film INS2 may be arranged on the first light-emitting element LDs1, and another portion of the second insulating film INS2 may be arranged on the first insulating film INS1.

First, the second insulating film INS2 may overlap an active layer 12 of the first light-emitting element LDs1. At least a portion of the second insulating film INS2 may be positioned on a rear surface of the first light-emitting element LDs1. The second insulating film INS2 formed on the rear surface of the first light-emitting element LDs1 may fill a gap between the first insulating film INS1 and the first light-emitting element LDs1 in a process of forming the second insulating film INS2 on the first light-emitting element.

Another portion of the second insulating film INS2 may be arranged adjacent to a position at which the first contact hole CH1 may be formed and/or a position at which the second contact hole CH2 may be formed.

For example, a portion of the second insulating film INS2 may be arranged in the form surrounding the first contact hole CH1 when viewed in a plan view. Another portion of the second insulating film INS2 may be arranged in the form surrounding the second contact hole CH2 when viewed in a plan view.

The second insulating film INS2 may include at least one of an organic material and/or an inorganic material. According to an example, the inorganic material may include at least one selected from silicon oxide ($SiO_x$), silicon nitride ($SiN_x$), silicon oxynitride ($SiO_xN_y$), aluminum oxide ($AlO_x$), and titanium oxide ($TiO_x$). The organic material may include at least one selected from a general-purpose polymer (PMMA, PS or the like), a polymer derivative including a phenol group, an acrylic-based polymer, an imide-based polymer, an arylether-based polymer, an amide-based polymer, a fluorine-based polymer, a p-xylene-based polymer, a vinyl alcohol-based polymer, and a blend thereof. However, the types of the organic material and the inorganic material are not limited to the examples described above.

A portion of the third insulating film INS3 may be positioned adjacent to the first contact hole CH1 on the second insulating film INS2. Another portion of the third insulating film INS3 may be positioned adjacent to the second contact hole CH2 on the second insulating film INS2.

Accordingly, the first contact hole CH1 may be formed in the first insulating film INS1, the second insulating film INS2, and the third insulating film INS3, and the second contact hole CH2 may be formed in the first insulating film INS1, the second insulating film INS2, and the third insulating film INS3.

The third insulating film INS3 may include an organic material and/or an inorganic material. According to an example, the third insulating film INS3 may include at least one selected from the materials listed as examples with reference to the second insulating film INS2.

The fourth insulating film INS4 may overlap the bank BNK, the first contact electrode CNE1, the second contact electrode CNE2, the second insulating film INS2, and the third insulating film INS3. The fourth insulating film INS4 may protect separate components of the display element part unit DPL from external influences. The fourth insulating film INS4 may include at least one selected from the materials listed as examples with reference to the second insulating film INS2, but the disclosure is not limited to a specific example.

Although not shown in the drawings, according to embodiments, a planarization layer (not shown) may be further provided on the fourth insulating film INS4. The planarization layer may reduce a step difference caused by various components disposed under the planarization layer, and an upper surface of the planarization layer may be substantially flat. The planarization layer may include an organic insulating film, but the disclosure is not limited thereto. The planarization layer may further include an inorganic insulating film.

A pixel PXL according to another embodiment will be described with reference to FIG. 7. In the following embodiments, the same components as the above-described embodiments will be denoted by the same reference numerals, descriptions thereof will be omitted or simplified, and differences will be described.

The structure of the pixel PXL according to another embodiment shown in FIG. 7 may be different from the structure of the pixel PXL according to the embodiment shown in FIG. 6 in that at least a portion of a third insulating film INS3 may be arranged between a first contact electrode CNE1 and a second contact electrode CNE2.

Referring to FIG. 7, at least a portion of the third insulating film INS3 may be disposed on the first light-emitting element LDs1 and disposed between the first contact electrode CNE1 and the second contact electrode CNE2. Accordingly, a short circuit between the first contact electrode CNE1 and the second contact electrode CNE2 can be prevented, and the reliability of an electrical signal transmitted to the first light-emitting element LDs1 can be improved. In addition, another portion of the third insulating film INS3 may be positioned on the second contact electrode CNE2 and a bank BNK to protect the second contact electrode CNE2 from external factors.

The third insulating film INS3 may be formed after the second contact electrode CNE2 may be arranged so that a second contact hole CH2 may not be formed in the third insulating film INS3. Accordingly, as described above, a first contact hole CH1 may be formed in a first insulating film INS1, a second insulating film INS2, and the third insulating film INS3, and the second contact hole CH2 may be formed in the first insulating film INS1 and the second insulating film INS2.

A pixel PXL according to still another embodiment will be described with reference to FIG. 8.

The structure of the pixel PXL according to still another embodiment shown in FIG. 8 may be different from the structure of the pixel PXL according to the embodiment shown in FIG. 6 in that at least a portion of a third insulating film INS3 may be arranged on a second insulating film INS2 arranged on an upper surface of the first light-emitting element LDs1.

Referring to FIG. 8, at least a portion of the third insulating film INS3 may be positioned on the second insulating film INS2 overlapping the first light-emitting element LDs1. According to the embodiment, the second insulating film INS2 overlapping the first light-emitting element LDs1 may be an inorganic insulating film including an inorganic material, and the third insulating film INS3 which overlaps the first light-emitting element LDs1 and may be positioned on an upper surface of the second insulating film INS2 may be an organic insulating film including an organic material. Any of insulating layers positioned on the first light-emitting element LDs1 may be implemented as an organic insulating film so that process mass productivity may be improved.

In order to form the second insulating film INS2 and the third insulating film INS3 on the first light-emitting element LDs1, the second insulating film INS2 and the third insulating film INS3 may be deposited to overlap at least an upper portion of the first light-emitting element LDs1, and the second insulating film INS2 and the third insulating film INS3 may be etched together (for example, through a dry etching process). Thereafter, a base contact electrode (not shown) for forming a first contact electrode CNE1 and a second contact electrode CNE2 may be deposited and then patterned to provide the first contact electrode CNE1 and the second contact electrode CNE2. For example, referring to a cross-section in which each of first contact hole CH1 and the second contact hole CH2 may be formed in detail, the second insulating film INS2 and the third insulating film INS3 may be etched in a single process so that an upper surface of the second insulating film INS2 may be entirely overlapped by the third insulating film INS3.

Figure 12:
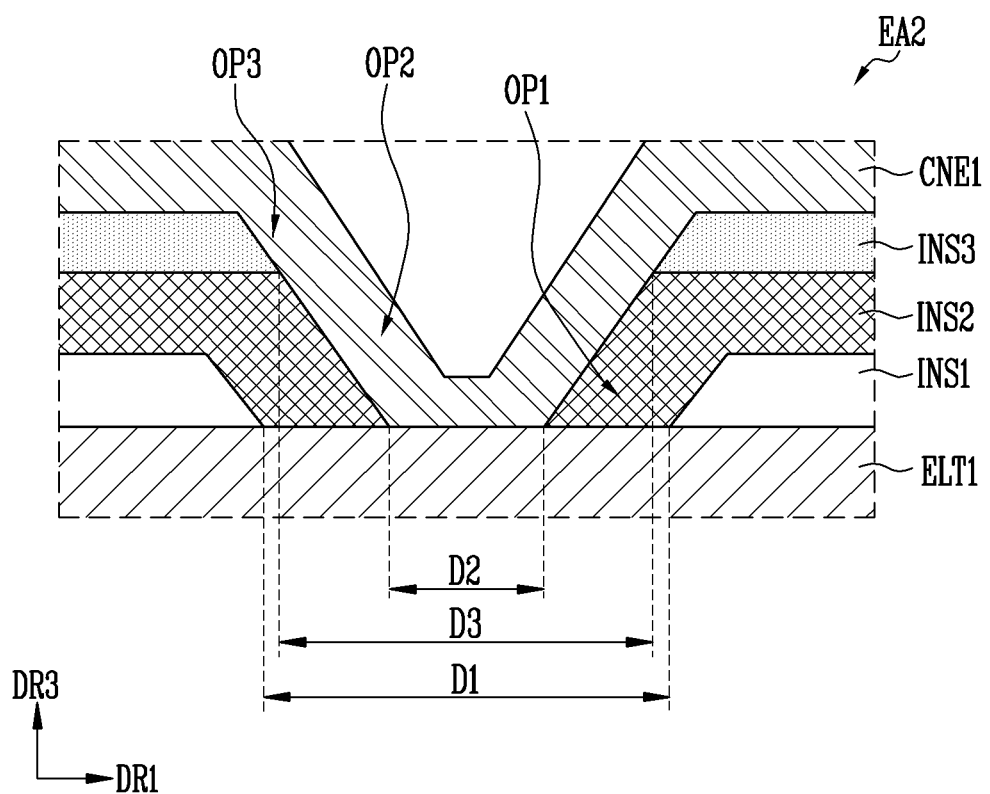
FIG. 12 is a schematic cross-sectional view of a first contact hole according to another embodiment.
Figure 13:
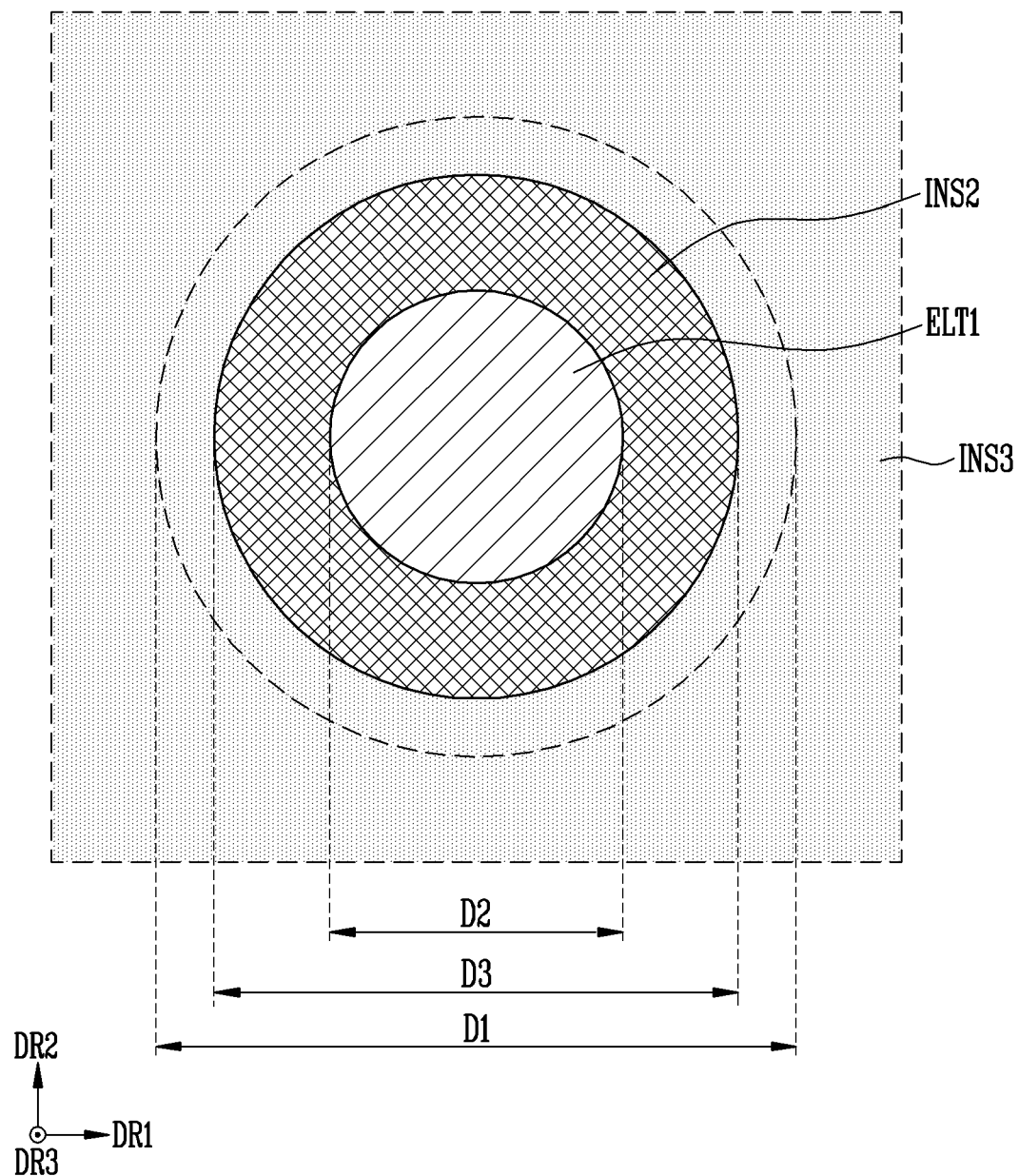
FIG. 13 is a schematic plan view of the first contact hole according to another embodiment.

Hereinafter, structures of the first contact hole CH1 and the second contact hole CH2 according to embodiments will be described with reference to FIGS. 10 to 13. FIG. 10 is a schematic cross-sectional view of a first contact hole according to an embodiment. FIG. 11 is a schematic plan view of the first contact hole according to an embodiment. FIG. 12 is a schematic cross-sectional view of a first contact hole according to another embodiment. FIG. 13 is a schematic plan view of the first contact hole according to another embodiment. Each of FIGS. 11 and 13 shows a plan view of an area adjacent to a first contact hole CH1 and a second contact hole CH2 for clearly representing the drawing. FIG. 10 may be an enlarged view of area EA1 of FIG. 6. FIG. 12 may be an enlarged view of area EA2 of FIG. 8.

The technical features of a first contact hole CH1 described below may be equally applied to a second contact hole CH2 according to embodiments, and accordingly, descriptions will be given focusing on the first contact hole CH1 according to embodiments.

Figure 10:
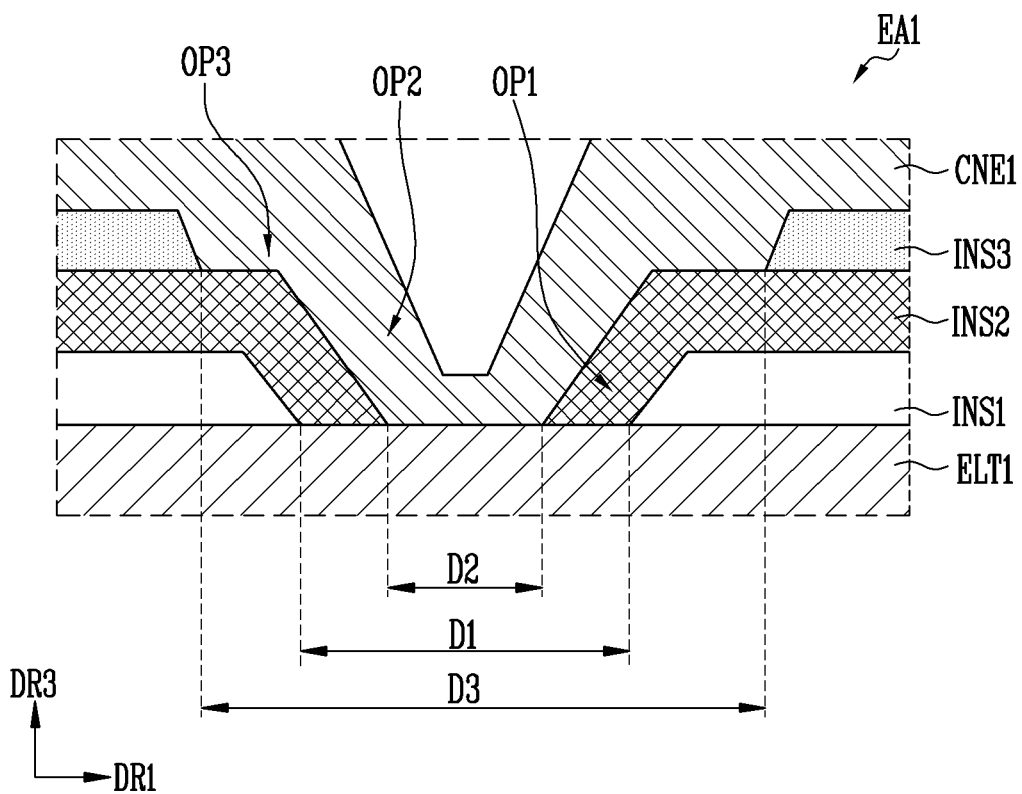
FIG. 10 is a schematic cross-sectional view of a first contact hole according to an embodiment.
Figure 11:
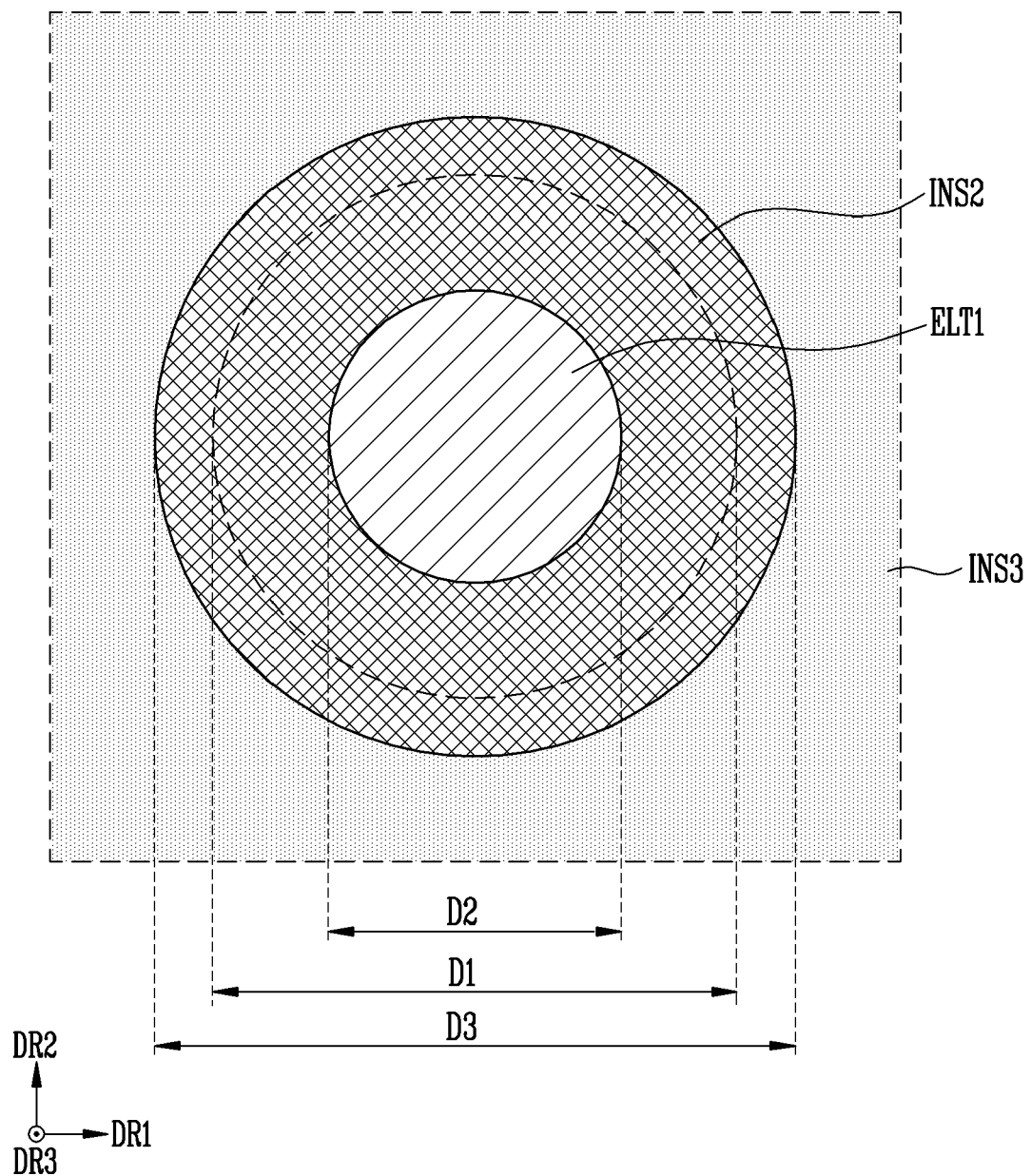
FIG. 11 is a schematic plan view of the first contact hole according to an embodiment.

First, referring to FIGS. 10 and 11, first to third insulating films INS1 to INS3 may be sequentially stacked and may include openings, and a first contact electrode CNE1 may be electrically connected to a first electrode ELT1 through the openings formed in the first to third insulating films INS1 to INS3.

The first insulating film INS1 may include a first opening OP1 exposing the first electrode ELT1, a second insulating film INS2 may include a second opening OP2 exposing the first electrode ELT1, and the third insulating film INS3 may include a third opening OP3 exposing the first electrode ELT1 and the second insulating film INS2. The first opening OP1 may have a first diameter D1, the second opening OP2 may have a second diameter D2, and the third opening OP3 may have a third diameter D3. The first diameter D1 may be greater than the second diameter D2 and may be smaller than the third diameter D3. According to an example, the first diameter D1 may be in a range of about 8 μm to about 10 μm, and the second diameter D2 may be in a range of about 4 μm to about 6 μm, but the disclosure is not limited to a specific numerical range.

The diameter of each of the first to third openings OP1 to OP3 may be defined as the smallest value among the diameters of openings defined by each of the first to third insulating films INS1 to INS3. However, the disclosure is not limited thereto, and the diameter of each of the first to third openings OP1 to OP3 may be defined as the greatest or average value among the diameters of the openings defined by each of the first to third insulating films INS1 to INS3.

Since the first insulating film INS1 and the second insulating film INS2 may be manufactured such that the second diameter D2 of the second opening OP2 may be greater than the first diameter D1 of the first opening OP1, the second insulating film INS2 may overlap a side surface of the first insulating film INS1. Accordingly, the first insulating film INS1 may be overlapped by the second insulating film INS2 so as to not extend to (e.g., be in contact with) the first contact electrode CNE1. A side surface of the first insulating film INS1 may be defined by the first opening OP1.

As described above, according to an example, the first insulating film INS1 may be manufactured to have a DBR structure. A dry etching process may be performed on the first insulating film INS1 to provide the first opening OP1. However, since the first insulating film INS1 has a structure in which multiple different layers may be alternately arranged, etch rates of the layers (for example, a first refractive layer 102 and a second refractive layer 104) constituting the first insulating film INS1 may be different, and thus, an inner surface of the first insulating film INS1 adjacent to the first opening OP1 may be non-uniform.

However, according to embodiments, the ununiform inner surface of the first insulating film INS1 may be overlapped with the second insulating film INS2 to not be exposed to the outside. Accordingly, the first contact electrode CNE1 may be formed on an inner surface of the second insulating film INS2 having a relatively uniform profile rather than the non-uniform inner surface of the first insulating film INS1, thereby preventing the disconnection of the first contact electrode CNE1.

The third insulating film INS3 may be manufactured such that the third diameter D3 of the third opening OP3 may be greater than the first diameter D1 of the first opening OP1, and thus, the third insulating film INS3 may be easily arranged on the second insulating film INS2.

According to embodiments, a difference between the third diameter D3 and the second diameter D2 may be smaller than a difference between the second diameter D2 and the first diameter D1. Accordingly, even though the first to third insulating films INS1 to INS3 may be stacked, inner surfaces adjacent to the first to third openings OP1 to OP3 in which the first contact hole CH1 may be provided may be formed as approximately uniform surfaces. However, the disclosure is not limited thereto, and according to embodiments, the difference between the third diameter D3 and the second diameter D2 may be greater than the difference between the second diameter D2 and the first diameter D1.

The first to third openings OP1 to OP3 may have a circular shape when viewed in a plan view. However, the disclosure is not limited thereto, and the first to third openings OP1 to OP3 may have various shapes including a polygonal shape and an elliptical shape which may be surrounded by a closed line.

The structure of the first contact hole CH1 and the second contact hole CH2 according to another embodiment described above with reference to FIG. 8 will be described with reference to FIGS. 12 and 13.

Referring to FIGS. 12 and 13, the structure of the first contact hole CH1 according to another embodiment may be different from an embodiment according to FIGS. 10 and 11 in that a third insulating film overlaps an entire upper surface of the insulating film INS2.

According to the embodiment, the second insulating film INS2 and the third insulating film INS3 may be etched together to provide a second opening OP2 and a third opening OP3. Accordingly, inner surfaces of each of the second insulating film INS2 and the third insulating film INS3 in which the first contact hole CH1 may be positioned may be formed approximately uniformly.

According to the embodiment, the second insulating film INS2 overlaps an inner side of a first insulating film INS1 having a BDR structure, and a step difference on the inner surface provided by the second opening OP2 and the third opening OP3 may be minimized, thereby further preventing the disconnection of the first contact electrode CNE1.

According to the embodiment, a third diameter D3 of the third opening OP3 may be smaller than a first diameter D1 of the first opening OP1 and may be greater than a second diameter D2 of the second opening OP2. This means that the second opening OP2 and the third opening OP3 defined by the second insulating film INS2 and the third insulating film INS3 may be positioned inside the first opening OP1 when viewed in a plan view. As a result, the inner surface of the first insulating film INS1 may be overlapped by the second insulating film INS2, and it may be possible to also prevent a step difference between the second insulating film INS2 and the third insulating film INS3 in a lateral direction (for example, a first direction DR1).

Hereinafter, a method of manufacturing a display device according to embodiments will be described with reference to FIGS. 14 to 24. FIGS. 14 to 24 are schematic cross-sectional views illustrating a method of manufacturing a display device according to embodiments. In FIGS. 14 to 24, a stacked structure including a first contact hole CH1 is illustrated.

Specifically, a method of manufacturing a display device according to an embodiment will be described first with reference to FIGS. 14 to 21, and a method of manufacturing a display device according to another embodiment will be described with reference to FIGS. 22 to 24.

Figure 14:
FIGS. 14 to 24 are schematic cross-sectional views illustrating processes of a method of manufacturing a display device according to embodiments.

Referring to FIG. 14, substrate SUB, a pixel circuit part PCL positioned on the substrate SUB, and a first electrode ELT1 on the pixel circuit part PCL may be arranged. Although not shown in the drawing, the first electrode ELT1 may be provided by depositing a base electrode (not shown) on the pixel circuit part PCL and etching at least a portion thereof (an etched position is not shown).

Figure 15:
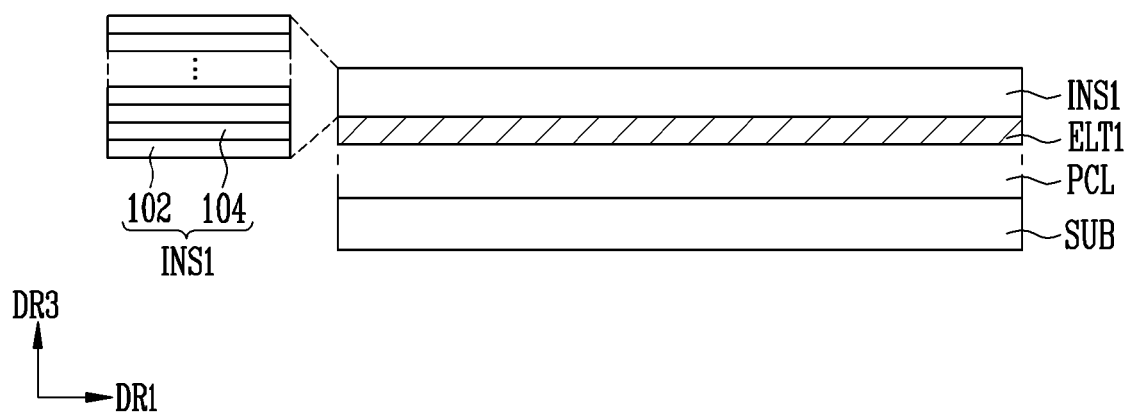

Referring to FIG. 15, a first insulating film INS1 may be formed on the first electrode ELT1. According to an example, the first insulating film INS1 may be deposited through a sputtering process, but the disclosure is not limited to a specific embodiment.

In the operation, in order to form the first insulating film INS1 provided to function as a BDR, a first refractive layer 102 and a second refractive layer 104 may be alternately arranged. FIG. 15 illustrates that the first refractive layer 102 constitutes a base layer of the first insulating film INS1, and the second refractive layer 104 and the first refractive layer 102 may be alternately arranged thereon, but the disclosure is not limited thereto. According to embodiments, the second refractive layer 104 may constitute the base layer of the first insulating film INS1.

According to embodiments, each of the first refractive layer 102 and the second refractive layer 104 may be an inorganic insulating film. As an example, each of the first refractive layer 102 and the second refractive layer 104 may include at least one selected from the materials listed as examples with reference to FIG. 9. The first refractive layer 102 and the second refractive layer 104 may differ in only one of a substance, a material, and a composition ratio, and thus, the first refractive layer 102 and the second refractive layer 104 may have different refractive indices, which may be sufficient.

Figure 16:
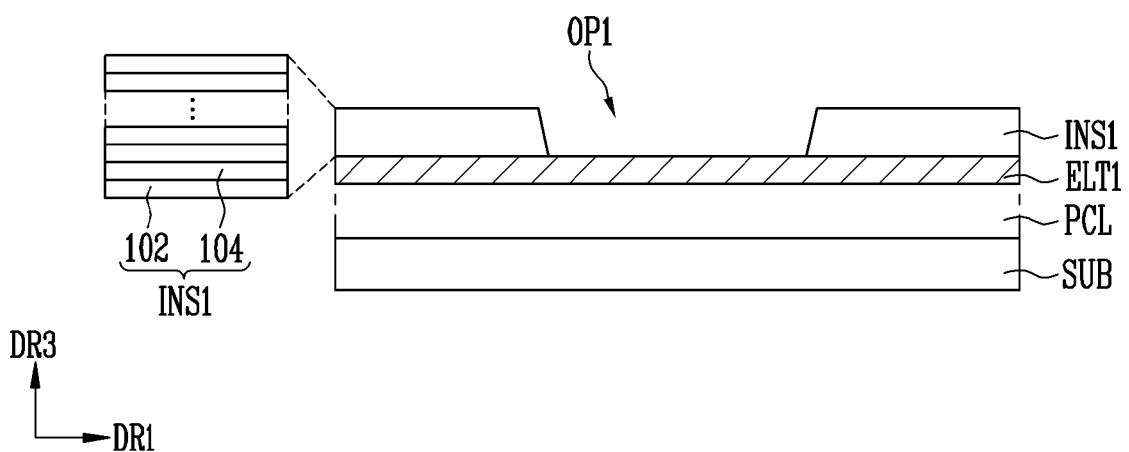

Thereafter, referring to FIG. 16, a first opening OP1 may be formed by etching a portion of the first insulating film INS1. At least a portion of the first opening OP1 may constitute a first contact hole CH1.

Since an etching process may be performed on the first insulating film INS1, at least a portion of each of the first refractive layer 102 and the second refractive layer 104 may be removed. The first refractive layer 102 and the second refractive layer 104 may include different materials. For this reason, an etch rate with respect to the first refractive layer 102 may be different from an etch rate with respect to the second refractive layer 104. As an example, the first refractive layer 102 may have a first etch rate, and the second refractive layer 104 may have a second etch rate different from the first etch rate.

As a result, in case that the etching process is performed on the first insulating film INS1, an etching amount of the first refractive layer 102 may be different from the etching amount of the second refractive layer 104. Accordingly, in case that the etching process for forming the first opening OP1 may be performed, an etched surface of the first insulating film INS1 may be formed non-uniformly.

Figure 17:
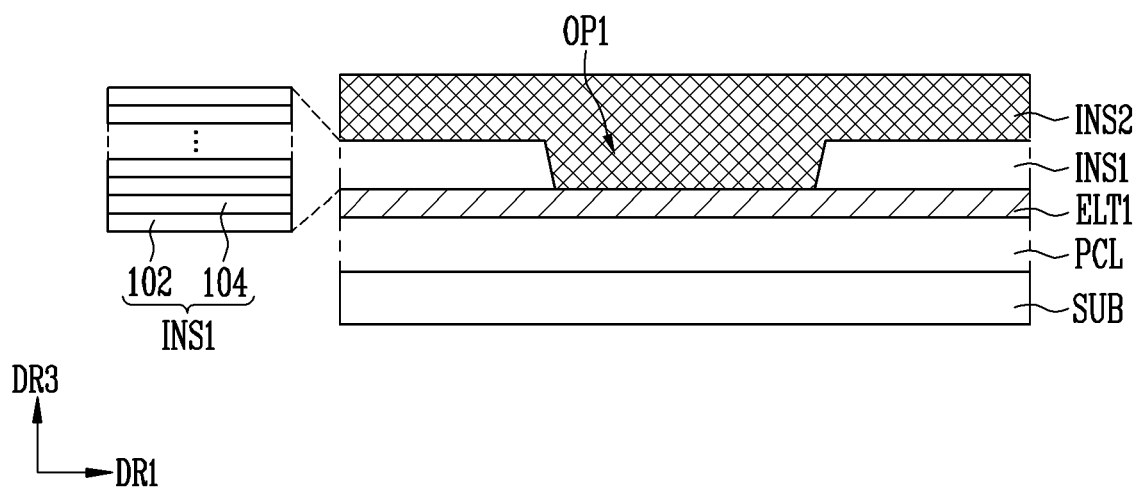
Figure 18:
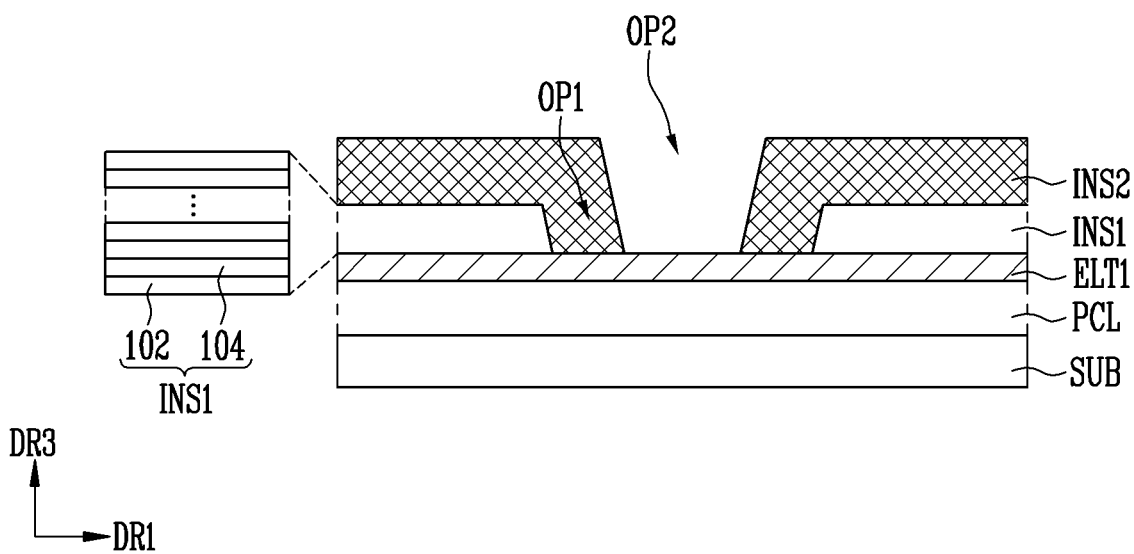

Referring to FIGS. 17 and 18, a second insulating film INS2 may be formed on the first insulating film INS1. The second insulating film INS2 may be disposed to overlap the first opening OP1, and a second opening OP2 may be formed by performing an etching process on the second insulating film INS2. A diameter of the second opening OP2 may be smaller than a diameter of the first opening OP1.

Although not shown in the drawing, the second insulating film INS2 may be formed on a light-emitting element LD in the same process.

By performing the operation, an inner surface of the first insulating film INS1 may be overlapped (e.g., covered). As described above, the etched surface of the first insulating film INS1 may be formed non-uniformly. In case that a first contact electrode CNE1 is arranged on a non-uniformly formed surface, the risk of disconnection of the first contact electrode CNE1 may be increased. However, according to an embodiment, the diameter of the second opening OP2 may be smaller than the diameter of the first opening OP1. Accordingly, even in case that at least a portion of the second insulating film INS2 is removed to form the first contact hole CH1, the inner surface of the first insulating film INS1 may still be overlapped with the second insulating film INS2. As a result, even in case that the first insulating film INS1 having a non-uniform etched surface may be overlapped so that the first contact electrode CNE1 may be electrically connected to a first electrode ELT1 through the first contact hole CH1 in a subsequent process, a disconnection phenomenon of the first contact electrode CNE1 can be prevented.

Figure 19:
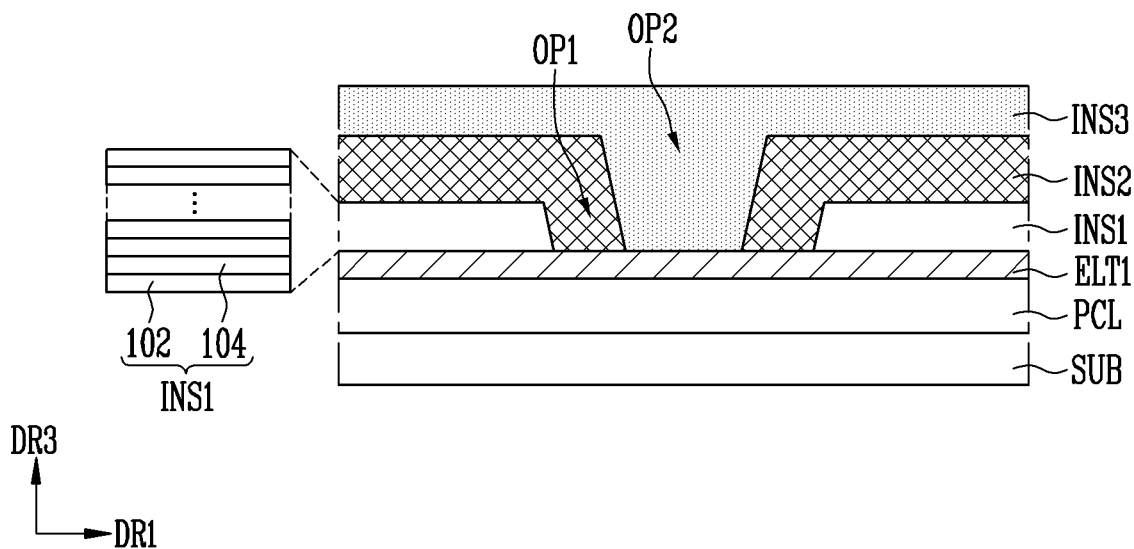
Figure 20:
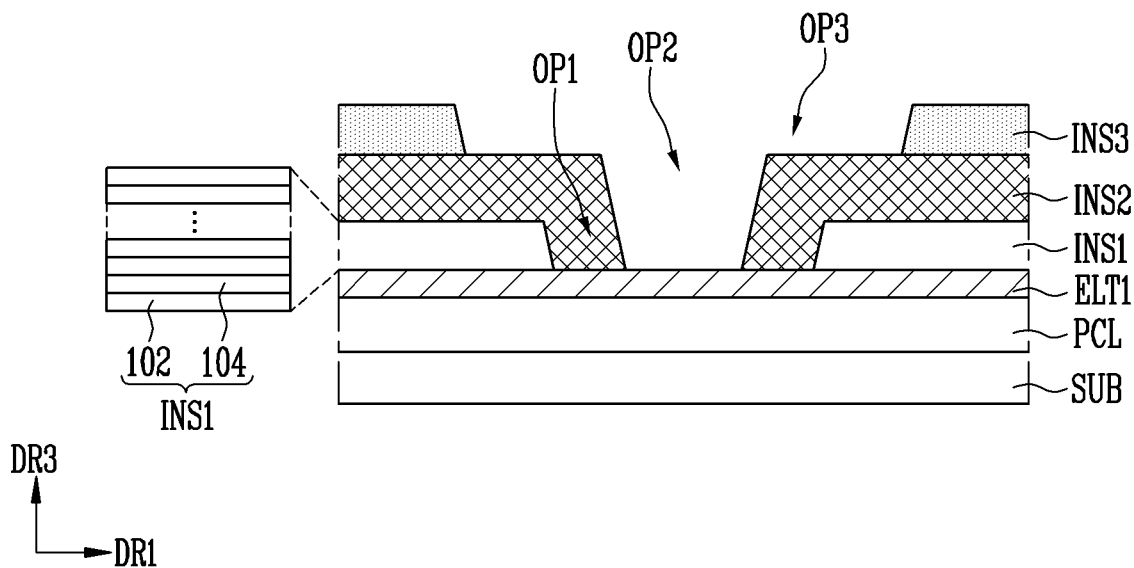

Referring to FIGS. 19 and 20, a third insulating film INS3 may be formed on the second insulating film INS2. At least a portion of the third insulating film INS3 may be provided in the second opening OP2. A third opening OP3 may be formed in the third insulating film INS3. According to an embodiment, a diameter of the third opening OP3 may be greater than the diameter of each of the first and second openings OP1 and OP2.

Figure 21:
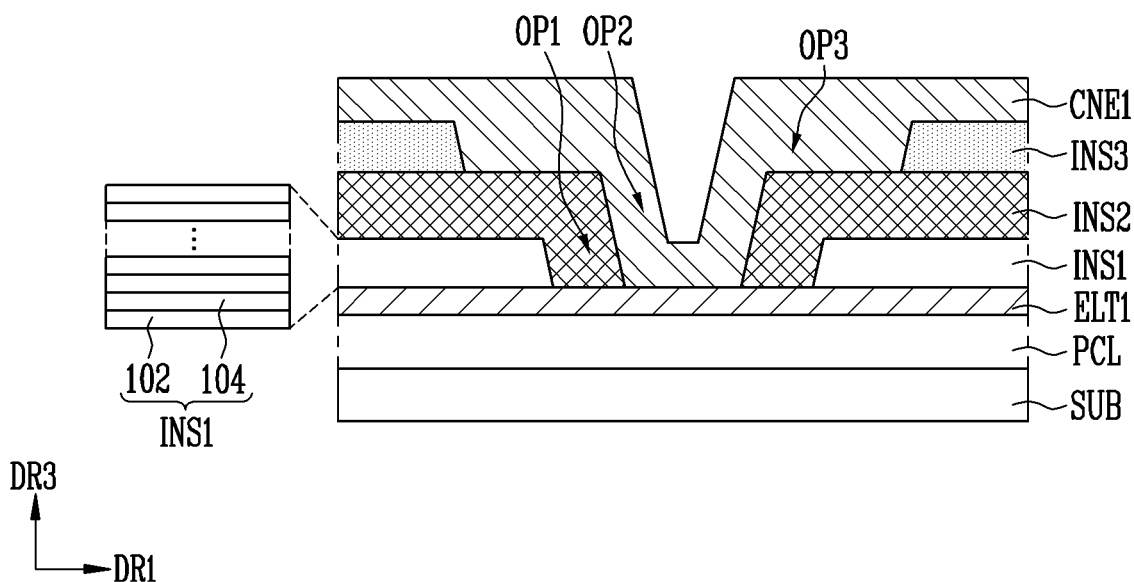

Thereafter, referring to FIG. 21, the first contact electrode CNE1 may be patterned. Although not shown in the drawing, a photoresist may be provided in an area in which the first contact electrode CNE1 is to be arranged, and an exposure process may be performed. Accordingly, the first contact electrode CNE1 may be connected to the first electrode ELT1 through the first contact hole CH1. As described above, the inner surface of the first insulating film INS1 corresponding to the first opening OP1 may be overlapped with the second insulating film INS2. As a result, the first contact electrode CNE1 may not be in contact the first insulating film INS1 in the first contact hole CH1. The first contact electrode CNE1 may be in physical contact with the second insulating film INS2 having a uniform inner surface as compared with the inner surface of the first insulating film INS1 in the first contact hole CH1.

Hereinafter, the method of manufacturing a display device according to another embodiment will be described with reference to FIGS. 22 to 24. Contents that may overlap the above-described contents will be briefly described or omitted and differences from the above-described embodiment will be described.

Figure 22:
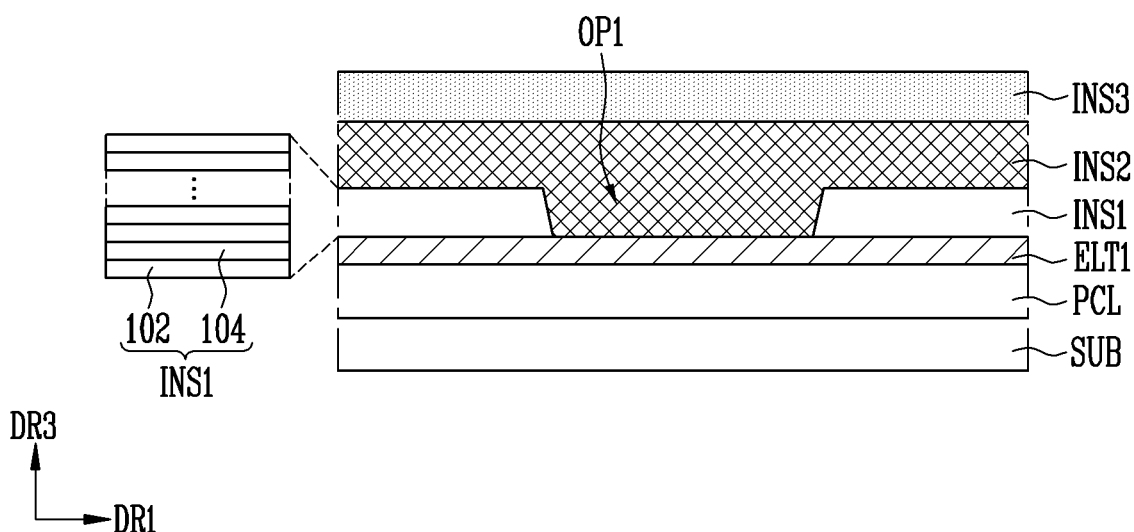

Referring to FIG. 22, a substrate SUB, a pixel circuit part PCL, a first electrode ELT1, a first insulating film INS1, and a second insulating film INS2 may be provided. A third insulating film INS3 may be formed on the second insulating film INS2. According to an example, the second insulating film INS2 may include an inorganic material, and the third insulating film INS3 may include an organic material, but the disclosure is not limited thereto.

Referring to this drawing, another embodiment may be different from the above-described embodiment in that before a time of forming the third insulating film INS3, a second opening OP2 with respect to the second insulating film INS2 may not be formed.

Although not shown in the drawing, the third insulating film INS3 may be formed on the second insulating film INS2 formed on a light-emitting element LD. Accordingly, at least a portion of the third insulating film INS3 may overlap the light-emitting element LD and the second insulating film INS2. According to the embodiment, the second insulating film INS2 may include an inorganic material, and the third insulating film INS3 may include an organic material, but the disclosure is not limited thereto.

Figure 23:
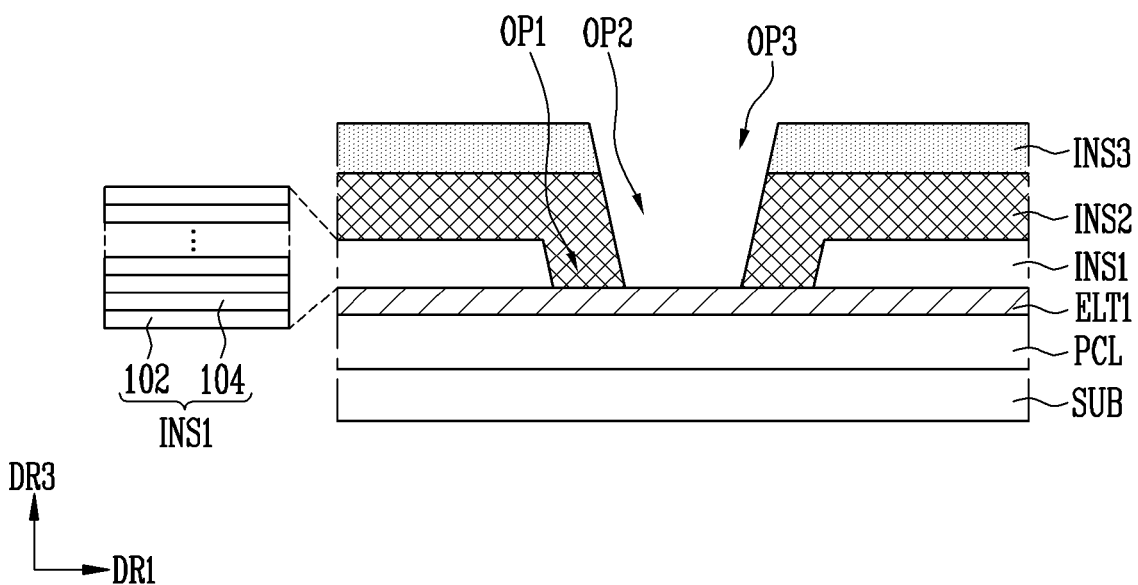

Referring to FIG. 23, an etching process may be performed on the second insulating film INS2 and the third insulating film INS3 together. For example, according to the embodiment, the second opening OP2 and a third opening OP3 may be formed in a single process. By performing the etching process, the second opening OP2 may be formed in the second insulating film INS2, and a third opening OP3 may be formed in the third insulating film INS3 so that the first electrode ELT1 may be exposed to the outside. A diameters of each of the second opening OP2 and the third opening OP3 may be smaller than a diameter of a first opening OP1, but the disclosure is not limited thereto. In this drawing, the diameter of the second opening OP2 is illustrated as being smaller than the diameter of the first opening OP1, but according to embodiments, the diameter of the second opening OP2 may be the same as the diameter of the third opening OP3.

In the embodiment, etching on the second insulating film INS2 and the third insulating film INS3 may be performed in a single process, thereby preventing a step difference on inner surfaces of the second insulating film INS2 and the third insulating film INS3.

Figure 24:
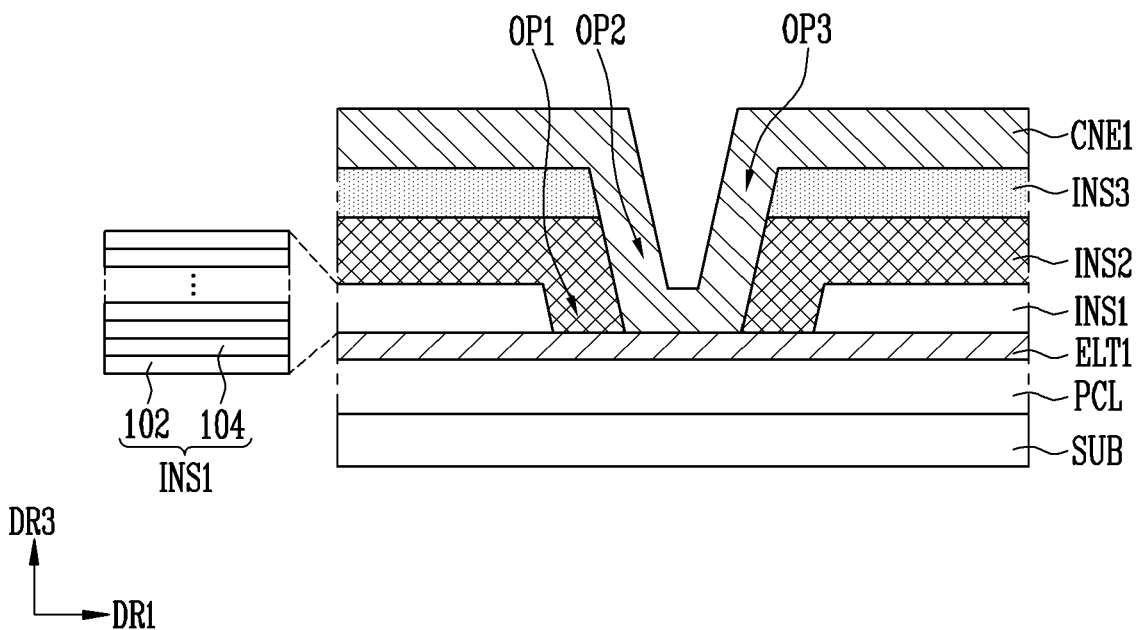

Thereafter, referring to FIG. 24, the first contact electrode CNE1 may be patterned to be connected to the first electrode ELT1 through a first contact hole CH1. Even In another embodiment, as described above, the first contact electrode CNE1 may not extend to an inner surface of the first insulating film INS1 in the first contact hole CH1. Accordingly, the disconnection of the first contact electrode CNE1 can be prevented, thereby improving the reliability of an electrical signal with respect to a display device according to embodiments.

According to an embodiment of the disclosure, it may be possible to provide a display device in which an electrode connected to a light-emitting element may be prevented from being disconnected and electrical reliability may be improved, and a method of manufacturing the same.

Effects of the disclosure may not be limited to the above, and other effects of the disclosure will be clearly understandable to those having ordinary skill in the art from the disclosure together with accompanying drawings.

The spirit of the disclosure has been disclosed with reference to sample embodiments. It will be appreciated by those skilled in the art that various modifications, changes, and substitutions can be made without departing from the essential characteristics of the disclosure. Therefore, the embodiments of the disclosure described above may be implemented independently or in combination with each other.

Therefore, the embodiments disclosed are not intended as a limit to the technical scope of the disclosure, but rather to explain the disclosure. The disclosure should be construed broadly so as to include equivalents and modifications.

What is claimed is:

1. A display device comprising:
a first electrode disposed on a substrate;
a first insulating film disposed on the first electrode and having a first opening;
a light-emitting element disposed directly on the first insulating film;

a second insulating film disposed on the first insulating film, contacted with the first insulating film, and having a second opening; and
a contact electrode electrically contacting at least a portion of the first electrode through the first opening and the second opening, wherein
a side surface of the first insulating film defines the first opening, and
the second insulating film overlaps the side surface of the first insulating film such that the contact electrode and the first insulating film are not in contact with each other.

2. The display device of claim 1, wherein the first insulating film includes:
a first refractive layer having a first refractive index; and
a second refractive layer disposed on the first refractive layer and having a second refractive index greater than the first refractive index.

3. The display device of claim 2, wherein the first insulating film is a distributed Bragg reflector.

4. The display device of claim 3, further comprising a third insulating film disposed on the second insulating film and having a third opening formed therein.

5. The display device of claim 4, wherein
the first opening has a first diameter,
the second opening has a second diameter,
the third opening has a third diameter, and
the first diameter is greater than the second diameter and is smaller than the third diameter.

6. The display device of claim 5, wherein
the first diameter is in a range of about 8 µm to about 10 µm, and
the second diameter is in a range of about 4 µm to about 6 µm.

7. The display device of claim 4, wherein at least a portion of the second insulating film is disposed on the light-emitting element.

8. The display device of claim 7, wherein at least a portion of the contact electrode is electrically connected to the light-emitting element.

9. The display device of claim 7, wherein at least a portion of the third insulating film overlaps the second insulating film disposed on the light-emitting element.

10. The display device of claim 9, wherein
the second insulating film includes an inorganic material, and
the third insulating film includes an organic material.

11. The display device of claim 9, wherein
the first opening has a first diameter,
the second opening has a second diameter,
the third opening has a third diameter, and
the third diameter is smaller than the first diameter and is greater than the second diameter.

12. The display device of claim 1, wherein the first insulating film is disposed directly on the first electrode and disposed between the first electrode and the light emitting element.

13. The display device of claim 12, further comprising:
a second electrode spaced apart from the first electrode, wherein
the light emitting element is between the first electrode and the second electrode, and
wherein the first insulating film is disposed directly on the second electrode.

* * * * *